United States Patent
Masuoka et al.

(10) Patent No.: US 9,484,424 B2
(45) Date of Patent: Nov. 1, 2016

(54) SEMICONDUCTOR DEVICE WITH A NAND CIRCUIT HAVING FOUR TRANSISTORS

(71) Applicant: UNISANTIS ELECTRONICS SINGAPORE PTE. LTD., Singapore (SG)

(72) Inventors: Fujio Masuoka, Tokyo (JP); Masamichi Asano, Tokyo (JP)

(73) Assignee: Unisantis Electronics Singapore Pte. Ltd., Singapore (SG)

( * ) Notice: Subject to any disclaimer, the term of this patent is extended or adjusted under 35 U.S.C. 154(b) by 0 days.

(21) Appl. No.: 14/824,702

(22) Filed: Aug. 12, 2015

(65) Prior Publication Data
US 2015/0349079 A1    Dec. 3, 2015

Related U.S. Application Data

(63) Continuation of application No. PCT/JP2013/070588, filed on Jul. 30, 2013.

(51) Int. Cl.
*H01L 27/12*  (2006.01)
*H01L 29/423*  (2006.01)
*H01L 29/78*  (2006.01)
(Continued)

(52) U.S. Cl.
CPC . *H01L 29/42392* (2013.01); *H01L 21/823828* (2013.01); *H01L 21/823885* (2013.01); *H01L 27/1203* (2013.01); *H01L 27/1207* (2013.01); *H01L 29/78* (2013.01);
(Continued)

(58) Field of Classification Search
CPC ............ H01L 21/823885; H01L 29/7827; H01L 29/78642; H01L 21/823828; H01L 27/11524; H01L 29/42392; H01L 2027/11881; H01L 27/11807; H01L 29/66666; H01L 29/7841; H01L 29/78
See application file for complete search history.

(56) References Cited

U.S. PATENT DOCUMENTS 4,756,221 A    7/1988  Nitschmann et al.
5,031,809 A    7/1991  Roberts et al.
(Continued)

FOREIGN PATENT DOCUMENTS

JP    2009182317 A    8/2009
JP    2010251586 A    11/2010
(Continued)

OTHER PUBLICATIONS

Hirokazu Yoshizawa, DMOS OP AMP KAIRO JITSUMU SEKKEI NO KISO (CMOS OP Amplifier Circuit, Basis of Practical Design), CQ Publishing Co., Ltd., May 15, 2007, p. 23.
(Continued)

*Primary Examiner* — Khiem D Nguyen
(74) *Attorney, Agent, or Firm* — Laurence Greenberg; Werner Stemer; Ralph Locher

(57) ABSTRACT

A semiconductor device includes a two-input NAND circuit including four MOS transistors arranged in a line. Each of the MOS transistors is disposed on a planar silicon layer disposed on a substrate. The drain, gate, and source of the MOS transistor are arranged in the vertical direction. The gate surrounds a silicon pillar. The planar silicon layer is constituted by a first activation region of a first conductivity type and a second activation region of a second conductivity type. The first and second activation regions are connected to each other via a silicon layer disposed on a surface of the planar silicon layer, so as to form a NAND circuit having a small area.

16 Claims, 33 Drawing Sheets

(51) Int. Cl.
*H03K 19/20* (2006.01)
*H03K 19/0948* (2006.01)
*H01L 21/8238* (2006.01)
*H01L 29/786* (2006.01)

(52) U.S. Cl.
CPC ..... *H01L 29/7827* (2013.01); *H03K 19/0948* (2013.01); *H03K 19/20* (2013.01); *H01L 29/78642* (2013.01)

(56) References Cited

U.S. PATENT DOCUMENTS

| | | | |
|---|---|---|---|
| 5,130,596 | A | 7/1992 | Umeki |
| 8,039,893 | B2 | 10/2011 | Masuoka et al. |
| 8,212,311 | B2 | 7/2012 | Masuoka et al. |
| 8,647,947 | B2 | 2/2014 | Masuoka et al. |
| 8,901,640 | B2 | 12/2014 | Masuoka et al. |
| 2008/0239789 | A1* | 10/2008 | Shino ................. G11C 11/404 365/149 |
| 2010/0207201 | A1 | 8/2010 | Masuoka et al. |
| 2010/0213539 | A1* | 8/2010 | Masuoka ............... H01L 21/84 257/329 |
| 2011/0018056 | A1* | 1/2011 | Takeuchi .......... H01L 21/76895 257/329 |
| 2012/0168819 | A1* | 7/2012 | Marino ............... H01L 29/7828 257/192 |

FOREIGN PATENT DOCUMENTS

| | | |
|---|---|---|
| JP | 2010258345 A | 11/2010 |
| JP | 2011108702 A | 6/2011 |
| JP | 4756221 B2 | 8/2011 |
| JP | 4756221 B2 * | 8/2011 ......... H01L 21/8244 |
| JP | 5130596 B2 | 1/2013 |
| WO | 2009096464 A1 | 8/2009 |
| WO | 2009096465 A1 | 8/2009 |

OTHER PUBLICATIONS

PCT—English translation of the International Preliminary Report on patentability dated Nov. 2, 2016.

* cited by examiner

SEMICONDUCTOR DEVICE WITH A NAND CIRCUIT HAVING FOUR TRANSISTORS

CROSS-REFERENCE TO RELATED APPLICATION

This application is a continuation, under 35 U.S.C. §120, of copending international application No. PCT/JP2013/070588, filed Jul. 30, 2013, which designated the United States; the prior application is herewith incorporated by reference in its entirety.

BACKGROUND OF THE INVENTION

1. Field of the Invention

The present invention relates to a semiconductor device.

2. Description of the Related Art

Semiconductor integrated circuits have recently become larger in scale. As for the leading-edge micro-processing units (MPUs), a semiconductor chip including as many as one giga transistors has been developed. In a so-called planar transistor according to the related art, an n-well region that forms PMOS and a p-type silicon substrate (or p-well region) that forms NMOS need to be completely isolated from each other, as described in "CMOS OP anpu kairo jitsumu sekkei no kiso," written by Yoshizawa Hirokazu, CQ Publishing, page 23. Each of the n-well region and the p-type silicon substrate needs a body terminal for applying a potential thereto, which increases the area.

To approach this issue, a surrounding gate transistor (SGT) has been suggested in which a source, gate, and drain are disposed in the vertical direction relative to a substrate, and the gate surrounds an island-shaped semiconductor layer. A method for manufacturing the SGT, and a CMOS inverter, NAND circuit, or SRAM cell using the SGT have been disclosed in, for example, Japanese Patent No. 5130596, Japanese Patent No. 5031809, Japanese Patent No. 4756221, and International Publication WO2009/096465.

FIG. 17 is a circuit diagram of an inverter using SGTs, and FIGS. 18A and 18B are layout diagrams of the inverter.

FIG. 17 is a circuit diagram of the inverter. Qp denotes a p-channel MOS transistor (hereinafter referred to as a PMOS transistor), Qn denotes an n-channel MOS transistor (hereinafter referred to as an NMOS transistor), IN denotes an input signal, OUT denotes an output signal, Vcc denotes a power supply voltage, and Vss denotes a reference voltage.

FIG. 18A illustrates, as an example, a plan view of the layout of the inverter illustrated in FIG. 17 including SGTs. FIG. 18B illustrates a cross-sectional view taken along a cut line A-A' in the plan view in FIG. 18A.

Referring to FIGS. 18A and 18B, planar silicon layers 2p and 2n are disposed on an insulating film, such as a buried oxide (BOX) layer disposed on a substrate. The planar silicon layers 2p and 2n are formed of a p+ diffusion layer and an n+ diffusion layer, respectively, through impurity implantation or the like. 3 denotes a silicide layer disposed on surfaces of the planar silicon layers 2p and 2n, which connects the planar silicon layers 2p and 2n to each other. 4n denotes an n-type silicon pillar; 4p denotes a p-type silicon pillar; 5 denotes a gate insulating film surrounding the n-type silicon pillar 4n and the p-type silicon pillar 4p; 6 denotes a gate electrode; and 6a denotes a gate line. A p+ diffusion layer 7p and an n+ diffusion layer 7n are formed at the tops of the n-type silicon pillar 4n and the p-type silicon pillar 4p, respectively, through impurity implantation or the like. 8 denotes a silicon nitride film for protecting the gate insulating film 5 and so forth; 9p and 9n denote silicide layers connected to the p+ diffusion layer 7p and the n+ diffusion layer 7n, respectively; 10p and 10n denote contacts that connect the silicide layers 9p and 9n to metal lines 13a and 13b; and 11 denotes a contact that connects the gate line 6a and a metal line 13c to each other.

The n-type silicon pillar 4n, the planar silicon layer 2p, the p+ diffusion layer 7p, the gate insulating film 5, and the gate electrode 6 constitute the PMOS transistor Qp. The p-type silicon pillar 4p, the planar silicon layer 2n, the n+ diffusion layer 7n, the gate insulating film 5, and the gate electrode 6 constitute the NMOS transistor Qn. The p+ diffusion layer 7p and the n+ diffusion layer 7n serve as a source, and the planar silicon layers 2p and 2n serve as a drain. The power supply voltage Vcc is supplied to the metal line 13a, the reference voltage Vss is supplied to the metal line 13b, and the input signal IN is connected to the metal line 13c. The silicide layer 3 that connects the planar silicon layer 2p of the PMOS transistor Qp and the planar silicon layer 2n of the NMOS transistor Qn corresponds to the output OUT.

In the inverter using SGTs illustrated in FIGS. 17, 18A, and 18B, the PMOS transistor and the NMOS transistor are completely isolated from each other in the structure, and thus well isolation is not necessary unlike in a planar transistor. Further, the silicon pillars serve as floating bodies, and thus a body terminal for supplying a potential to the wells is not necessary unlike in a planar transistor. Accordingly, a very compact layout (arrangement) is realized.

As described above, the greatest feature of an SGT is that, in terms of a structural principle, a lower line formed of a silicide layer existing on a substrate side relative to a silicon pillar and an upper line connected to a contact at an upper portion of the silicon pillar can be used.

SUMMARY OF THE INVENTION

An object of the present invention is to provide a low-cost logic semiconductor device by minimizing the area of the device by arranging two-input NAND circuits that are used most often in a logic circuit in a line to realize a compact arrangement by utilizing the feature of an SGT.

According to an aspect of the present invention, there is provided a semiconductor device including a NAND circuit including four transistors that are arranged in a line on a substrate. A source, a drain, and a gate of each of the four transistors are hierarchically disposed in a direction perpendicular to the substrate. Each of the four transistors includes a silicon pillar, an insulator surrounding a side surface of the silicon pillar, a gate surrounding the insulator, a source region disposed at an upper portion or lower portion of the silicon pillar, and a drain region disposed at the upper portion or lower portion of the silicon pillar and disposed on an opposite side of the source region relative to the silicon pillar. The four transistors include a first p-channel MOS transistor, a second p-channel MOS transistor, a first n-channel MOS transistor, and a second n-channel MOS transistor. The gate of the first p-channel MOS transistor and the gate of the first n-channel MOS transistor are connected to each other. The gate of the second p-channel MOS transistor and the gate of the second n-channel MOS transistor are connected to each other. The drain region of the first p-channel MOS transistor, the drain region of the second p-channel MOS transistor, and the drain region of the first n-channel MOS transistor are disposed on a side of the substrate relative to the silicon pillars. The source region of the second n-channel MOS transistor is disposed on the side of the substrate relative to the silicon pillar. The drain region of the first p-channel MOS transistor, the drain region of the second p-channel MOS transistor, and the drain region of first n-channel MOS transistor are connected to one another via a silicide region. The source region of the first n-channel MOS transistor and the drain region of the second n-channel MOS transistor are connected to each other via a contact. The source region of the first p-channel MOS transistor and the source region of the second p-channel MOS transistor are connected to a power supply terminal via a contact. The source region of the second n-channel MOS transistor is connected to a reference power supply terminal via a silicide region.

The four transistors may be arranged in a line in order of the first n-channel MOS transistor, the first p-channel MOS transistor, the second p-channel MOS transistor, and the second n-channel MOS transistor.

The four transistors may be arranged in a line in order of the second p-channel MOS transistor, the first p-channel MOS transistor, the first n-channel MOS transistor, and the second n-channel MOS transistor.

The gate of the second p-channel MOS transistor and the gate of the second n-channel MOS transistor may be connected to each other via a contact.

The four transistors may be arranged in a line in order of the first p-channel MOS transistor, the first n-channel MOS transistor, the second p-channel MOS transistor, and the second n-channel MOS transistor.

According to another aspect of the present invention, there is provided a semiconductor device including a NAND circuit including four transistors that are arranged in a line on a substrate. A source, a drain, and a gate of each of the four transistors are hierarchically disposed in a direction perpendicular to the substrate. Each of the four transistors includes a silicon pillar, an insulator surrounding a side surface of the silicon pillar, a gate surrounding the insulator, a source region disposed at an upper portion or lower portion of the silicon pillar, and a drain region disposed at the upper portion or lower portion of the silicon pillar and disposed on an opposite side of the source region relative to the silicon pillar. The four transistors include a first p-channel MOS transistor, a second p-channel MOS transistor, a first n-channel MOS transistor, and a second n-channel MOS transistor. The gate of the first p-channel MOS transistor and the gate of the first n-channel MOS transistor are connected to each other. The gate of the second p-channel MOS transistor and the gate of the second n-channel MOS transistor are connected to each other. The drain region of the first p-channel MOS transistor, the drain region of the second p-channel MOS transistor, the drain region of the first n-channel MOS transistor, and the drain region of the second n-channel MOS transistor are disposed on a side of the substrate relative to the silicon pillars. The drain region of the first p-channel MOS transistor, the drain region of the second p-channel MOS transistor, and the drain region of the first n-channel MOS transistor are connected to one another via a silicide region. The source region of the first n-channel MOS transistor and the drain region of the second n-channel MOS transistor are connected to each other via a contact and a silicide region. The source region of the first p-channel MOS transistor and the source region of the second p-channel MOS transistor are connected to a power supply terminal via a contact. The source region of the second n-channel MOS transistor is connected to a reference power supply terminal via a contact.

The four transistors may be arranged in a line in order of the first n-channel MOS transistor, the first p-channel MOS transistor, the second p-channel MOS transistor, and the second n-channel MOS transistor.

The four transistors may be arranged in a line in order of the second p-channel MOS transistor, the first p-channel MOS transistor, the first n-channel MOS transistor, and the second n-channel MOS transistor.

The gate of the second p-channel MOS transistor and the gate of the second n-channel MOS transistor may be connected to each other via a contact.

According to another aspect of the present invention, there is provided a semiconductor device including a NAND circuit including four transistors that are arranged in a line on a substrate. A source, a drain, and a gate of each of the four transistors are hierarchically disposed in a direction perpendicular to the substrate. Each of the four transistors includes a silicon pillar, an insulator surrounding a side surface of the silicon pillar, a gate surrounding the insulator, a source region disposed at an upper portion or lower portion of the silicon pillar, and a drain region disposed at the upper portion or lower portion of the silicon pillar and disposed on an opposite side of the source region relative to the silicon pillar. The four transistors include a first p-channel MOS transistor, a second p-channel MOS transistor, a first n-channel MOS transistor, and a second n-channel MOS transistor. The gate of the first p-channel MOS transistor and the gate of the first n-channel MOS transistor are connected to each other. The gate of the second p-channel MOS transistor and the gate of the second n-channel MOS transistor are connected to each other. The drain region of the first p-channel MOS transistor, the drain region of the second p-channel MOS transistor, and the drain region of the first n-channel MOS transistor are disposed on a side of the substrate relative to the silicon pillars. The source region of the second n-channel MOS transistor is disposed on the side of the substrate relative to the silicon pillar. The drain region of the first p-channel MOS transistor, the drain region of the second p-channel MOS transistor, and the drain region of first n-channel MOS transistor are connected to one another via a silicide region. The source region of the first n-channel MOS transistor and the drain region of the second n-channel MOS transistor are connected to each other via a contact and a silicide region. The source region of the first p-channel MOS transistor and the source region of the second p-channel MOS transistor are connected to a power supply terminal via a contact. The source region of the second n-channel MOS transistor is connected to a reference power supply terminal via a contact. The four transistors are arranged in a line in order of the first p-channel MOS transistor, the first n-channel MOS transistor, the second p-channel MOS transistor, and the second n-channel MOS transistor.

According to another aspect of the present invention, there is provided a semiconductor device including a NAND circuit including four transistors that are arranged in a line on a substrate. A source, a drain, and a gate of each of the four transistors are hierarchically disposed in a direction perpendicular to the substrate. Each of the four transistors includes a silicon pillar, an insulator surrounding a side surface of the silicon pillar, a gate surrounding the insulator, a source region disposed at an upper portion or lower portion of the silicon pillar, and a drain region disposed at the upper portion or lower portion of the silicon pillar and disposed on an opposite side of the source region relative to the silicon pillar. The four transistors include a first p-channel MOS transistor, a second p-channel MOS transistor, a first n-channel MOS transistor, and a second n-channel MOS transistor. The gate of the first p-channel MOS transistor and the gate of the first n-channel MOS transistor are connected to each other. The gate of the second p-channel MOS transistor and the gate of the second n-channel MOS transistor are connected to each other. The source region of the first p-channel MOS transistor, the source region of the second p-channel MOS transistor, and the source region of the first n-channel MOS transistor are disposed on a side of the substrate relative to the silicon pillars. The drain region of the second n-channel MOS transistor is disposed on the side of the substrate relative to the silicon pillar. The drain region of the first p-channel MOS transistor, the drain region of the second p-channel MOS transistor, and the drain region of first n-channel MOS transistor are connected to one another via a contact. The source region of the first n-channel MOS transistor and the drain region of the second n-channel MOS transistor are connected to each other via a silicide region. The source region of the first p-channel MOS transistor and the source region of the second p-channel MOS transistor are connected to a power supply terminal via a silicide region. The source region of the second n-channel MOS transistor is connected to a reference power supply terminal via a contact.

The four transistors may be arranged in a line in order of the first p-channel MOS transistor, the first n-channel MOS transistor, the second n-channel MOS transistor, and the second p-channel MOS transistor.

The source region of the first p-channel MOS transistor and the source region of the second p-channel MOS transistor may be connected to the power supply terminal via a silicide region and a contact, the silicide region extending in a direction perpendicular to a direction in which the four transistors are arranged in a line.

The NAND circuit may be one of a plurality of NAND circuits that are arranged in a direction perpendicular to the direction in which the four transistors are arranged in a line. The extended silicide regions are connected to one another, and one of the plurality of NAND circuits is connected to the power supply terminal via the extended silicide regions and a contact.

The four transistors may be arranged in a line in order of the second p-channel MOS transistor, the first p-channel MOS transistor, the first n-channel MOS transistor, and the second n-channel MOS transistor.

A gate line of the second p-channel MOS transistor and a gate line of the second n-channel MOS transistor may be supplied with signals through different signal lines via contacts.

Other features which are considered as characteristic for the invention are set forth in the appended claims.

Although the invention is illustrated and described herein as embodied in a semiconductor device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

First Embodiment

Figure 1:
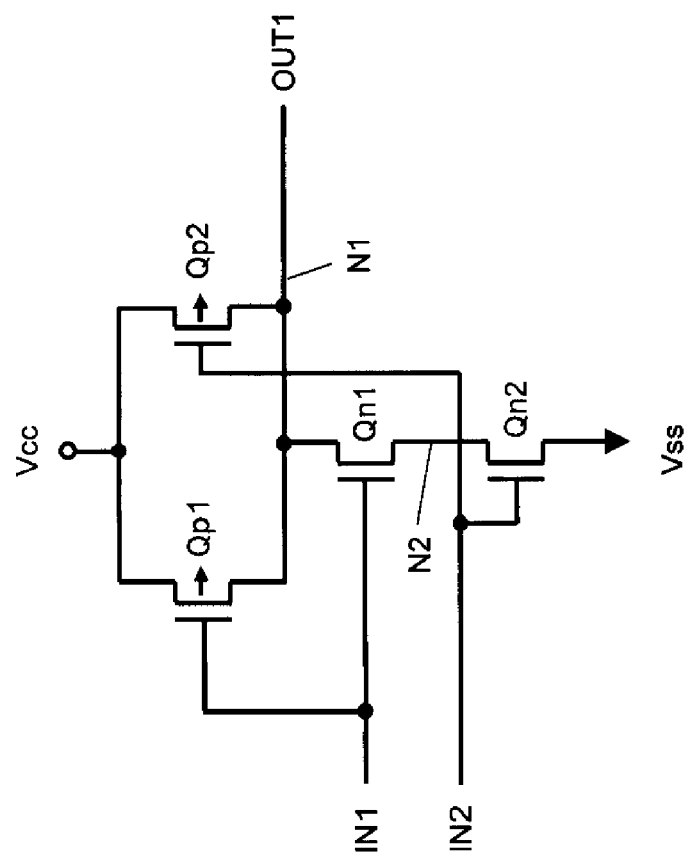
FIG. 1 is a first equivalent circuit diagram illustrating a NAND circuit according to an embodiment of the present invention.

FIG. 1 is an equivalent circuit diagram of a two-input NAND circuit applied to the present invention. Qp1 and Qp2 denote PMOS transistors each constituted by an SGT, and Qn1 and Qn2 denote NMOS transistors each constituted by an SGT. The sources of the PMOS transistors Qp1 and Qp2 are connected to a common power supply voltage Vcc, and the drains thereof are connected to a common node N1. The drain of the NMOS transistor Qn1 is connected to the node N1, the source thereof is connected to the drain of the NMOS transistor Qn2 via a node N2, and the source of the NMOS transistor Qn2 is connected to a reference voltage Vss. An input signal IN1 is connected to the gates of the PMOS transistor Qp1 and the NMOS transistor Qn1, and an input signal IN2 is connected to the gates of the PMOS transistor Qp2 and the NMOS transistor Qn2.

Figure 2A:
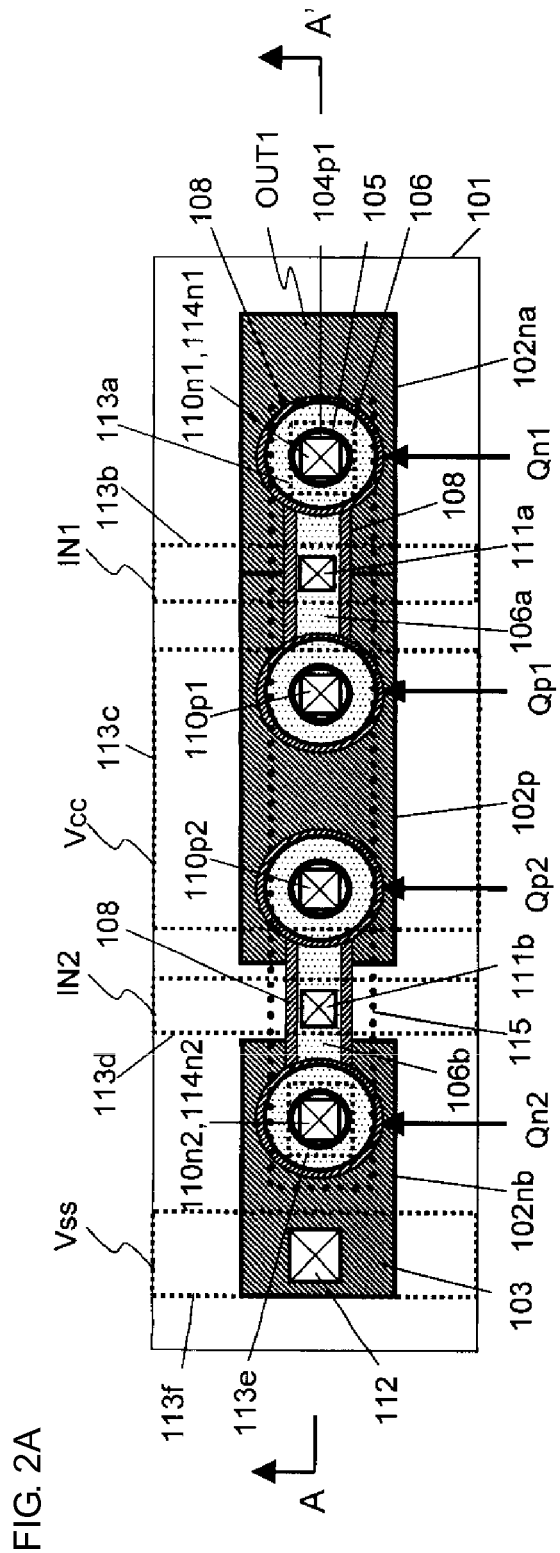
FIG. 2A is a plan view of a NAND circuit according to a first embodiment of the present invention.
Figure 2B:
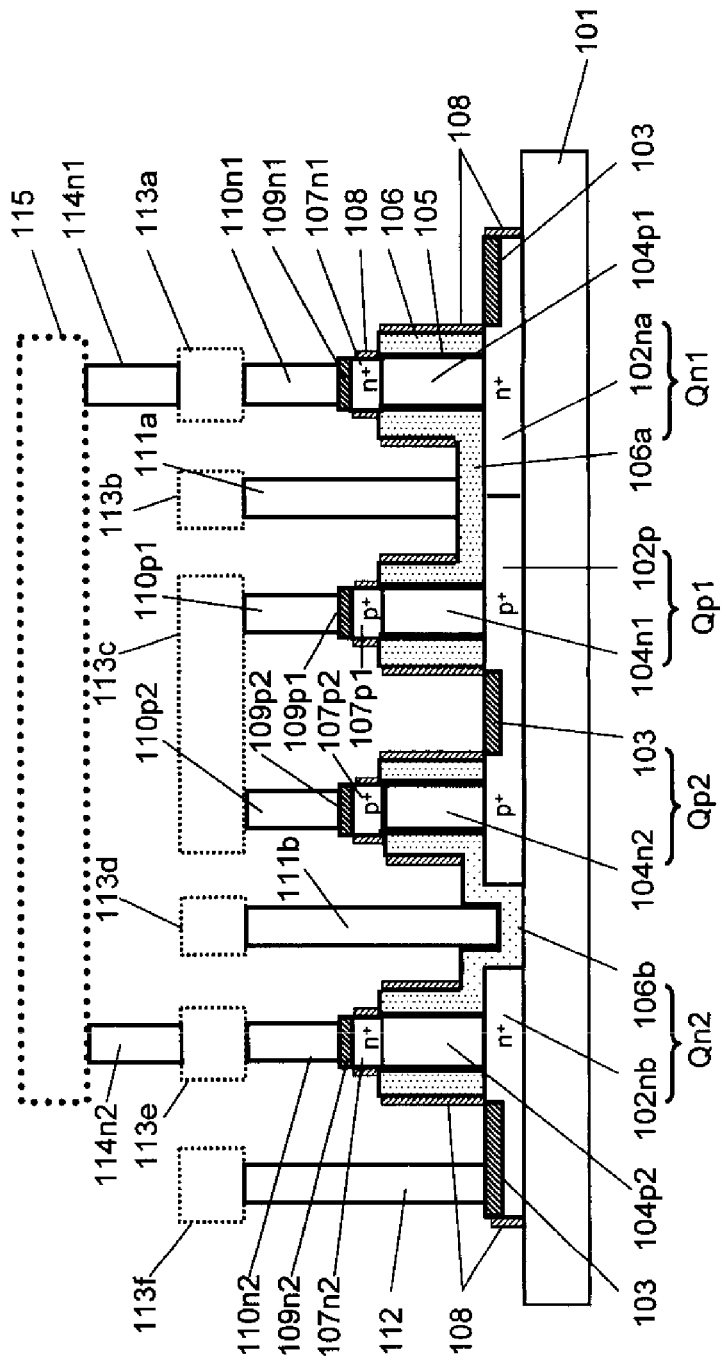
FIG. 2B is a cross-sectional view of the NAND circuit according to the first embodiment of the present invention.

FIGS. 2A and 2B illustrate a first embodiment. FIG. 2A is a plan view illustrating the layout (arrangement) of a two-input NAND circuit according to the present invention, and FIG. 2B is a cross-sectional view taken along a cut line A-A'.

Figure 18A:
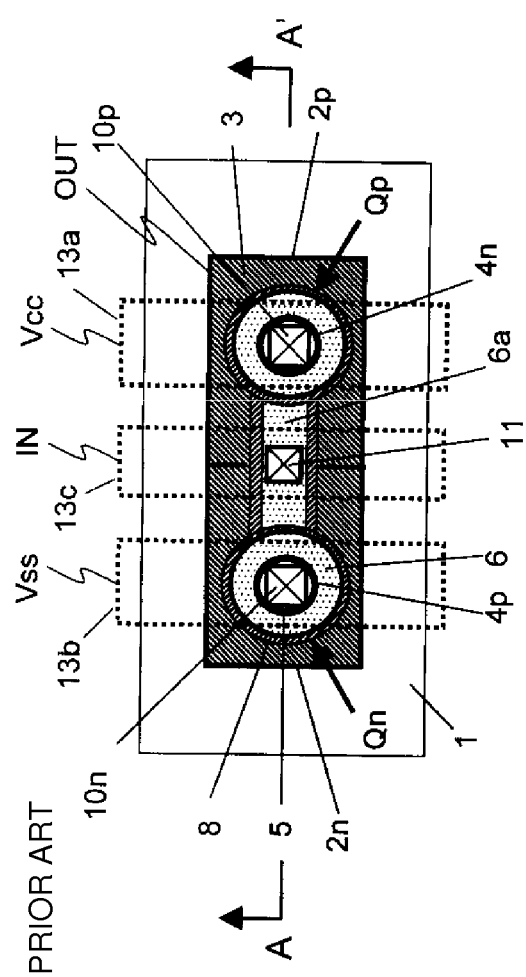
FIG. 18A is a plan view of the inverter according to the prior art.
Figure 18B:
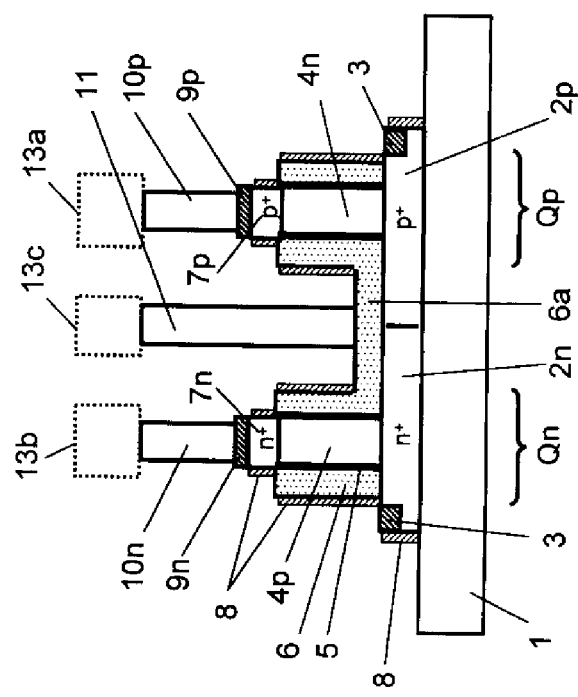
FIG. 18B is a cross-sectional view of the inverter according to the prior art.

Referring to FIG. 2A, the NMOS transistor Qn1, the PMOS transistor Qp1, the PMOS transistor Qp2, and the NMOS transistor Qn2 of the NAND circuit illustrated in FIG. 1 are arranged in a line from the right. In FIGS. 2A and 2B, the components having the same structure as that in FIGS. 18A and 18B are denoted by equivalent reference numerals in the 100s.

Planar silicon layers 102na, 102p, and 102nb are disposed on an insulating film, such as a buried oxide (BOX) layer 101 disposed on a substrate. The planar silicon layers 102na, 102p, and 102nb are formed of an n+ diffusion layer, a p+ diffusion layer, and an n+ diffusion layer, respectively, through impurity implantation or the like, and serve as lower diffusion layers. 103 denotes a silicide layer disposed on surfaces of the planar silicon layers 102na, 102p, and 102nb, which connects the planar silicon layers 102na and 102p to each other. 104n1 and 104n2 denote n-type silicon pillars; 104p1 and 104p2 denote p-type silicon pillars; 105 denotes a gate insulating film surrounding the silicon pillars 104n1, 104n2, 104p1, and 104p2; 106 denotes a gate electrode; and 106a and 106b denote gate lines. P+ diffusion layers 107p1 and 107p2 are formed at the tops of the n-type silicon pillars 104n1 and 104n2, respectively, through impurity implantation or the like, and serve as upper diffusion layers. N+ diffusion layers 107n1 and 107n2 are formed at the tops of the p-type silicon pillars 104p1 and 104p2, respectively, through impurity implantation or the like, and serve as upper diffusion layers. 108 denotes a silicon nitride film for protecting the gate insulating film 105; 109p1, 109p2, 109n1, and 109n2 denote silicide layers connected to the p+ diffusion layers 107p1 and 107p2 and the n+ diffusion layers 107n1 and 107n2, respectively; 110p1, 110p2, 110n1, and 110n2 denote contacts that connect the silicide layers 109p1, 109p2, 109n1, and 109n2 to first metal lines 113c, 113c, 113a, and 113e, respectively; 111a denotes a contact that connects the gate line 106a and a first metal line 113b to each other; and 111b denotes a contact that connects the gate line 106b and a first metal line 113d to each other. 112 denotes a contact that connects the silicide layer 103 connected to the planar silicon layer 102nb and a first metal line 113f to each other. 114n1 denotes a contact that connects the first metal line 113a and a second metal line 115 to each other; and 114n2 denotes a contact that connects the first metal line 113e and the second metal line 115 to each other.

The n-type silicon pillar 104n1, the planar silicon layer 102p, the p+ diffusion layer 107p1, the gate insulating film 105, and the gate electrode 106 constitute the PMOS transistor Qp1. The n-type silicon pillar 104n2, the planar silicon layer 102p, the p+ diffusion layer 107p2, the gate insulating film 105, and the gate electrode 106 constitute the PMOS transistor Qp2. The p-type silicon pillar 104p1, the planar silicon layer 102na, the n+ diffusion layer 107n1, the gate insulating film 105, and the gate electrode 106 constitute the NMOS transistor Qn1. The p-type silicon pillar 104p2, the planar silicon layer 102nb, the n+ diffusion layer 107n2, the gate insulating film 105, and the gate electrode 106 constitute the NMOS transistor Qn2.

The gate line 106a is connected to the gate electrode 106 of the PMOS transistor Qp1. The gate line 106b is connected to the gate electrode 106 of the PMOS transistor Qp2. The gate line 106a is connected to the gate electrode 106 of the NMOS transistor Qn1. The gate line 106b is connected to the gate electrode 106 of the NMOS transistor Qn2.

The planar silicon layers 102na and 102p serve as a common drain of the NMOS transistor Qn1 and the PMOS transistors Qp1 and Qp2, and are connected to an output OUT1. The p+ diffusion layer 107p1, which serves as the source of the PMOS transistor Qp1, is connected to the first metal line 113c via the silicide layer 109p1 and the contact 110p1, and the power supply voltage Vcc is supplied to the first metal line 113c. The p+ diffusion layer 107p2, which serves as the source of the PMOS transistor Qp2, is connected to the first metal line 113c via the silicide layer 109p2 and the contact 110p2. The n+ diffusion layer 107n1, which serves as the source of the NMOS transistor Qn1, is connected to the first metal line 113a via the silicide layer 109n1 and the contact 110n1, and the first metal line 113a is connected to the second metal line 115 via the contact 114n1. The n+ diffusion layer 107n2, which serves as the drain of the NMOS transistor Qn2, is connected to the first metal line 113e via the silicide layer 109n2 and the contact 110n2, and the first metal line 113e is connected to the second metal line 115 via the contact 114n2. Here, the source of the NMOS transistor Qn1 and the drain of the NMOS transistor Qn2 are connected to each other via the second metal line 115. The planar silicon layer 102nb serves as the source of the NMOS transistor Qn2 and is connected to the first metal line 113f via the silicide layer 103 and the contact 112. The reference voltage Vss is supplied to the first metal line 113f.

The input signal IN1 is supplied to the first metal line 113b, is supplied to the gate line 106a via the contact 111a, and is supplied to the gate electrodes of the PMOS transistor Qp1 and the NMOS transistor Qn1. The input signal IN2 is supplied to the first metal line 113d, is supplied to the gate line 106b via the contact 111b, and is supplied to the gate electrodes of the PMOS transistor Qp2 and the NMOS transistor Qn2.

According to this embodiment, four SGTs constituting a two-input NAND circuit can be arranged in a line without providing wasteful lines and contact regions, and a semiconductor device with a reduced area can be provided.

Second Embodiment

Figure 3A:
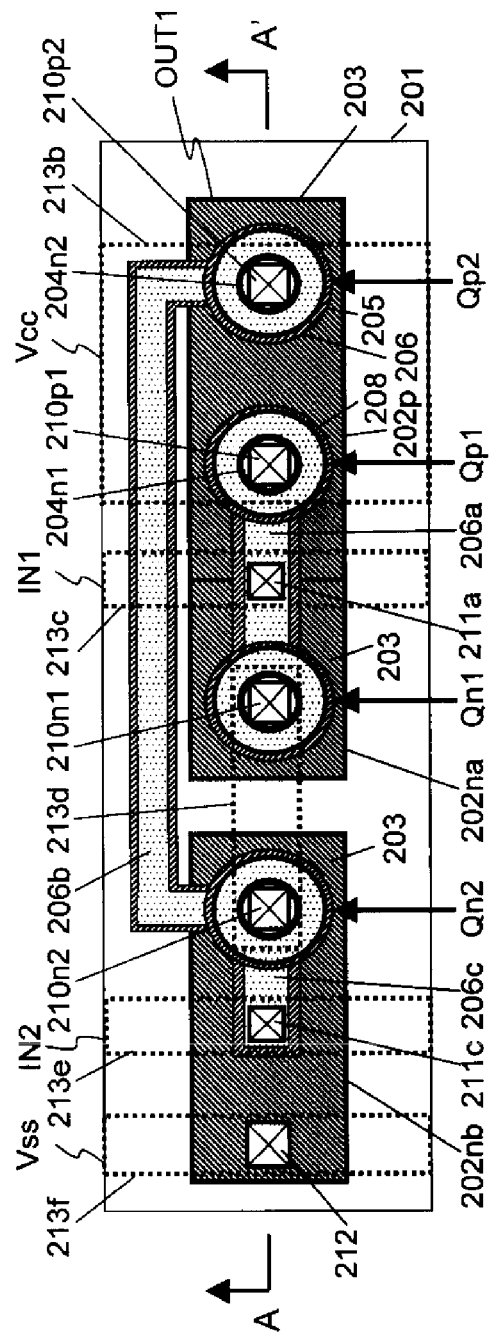
FIG. 3A is a plan view of a NAND circuit according to a second embodiment of the present invention.
Figure 3B:
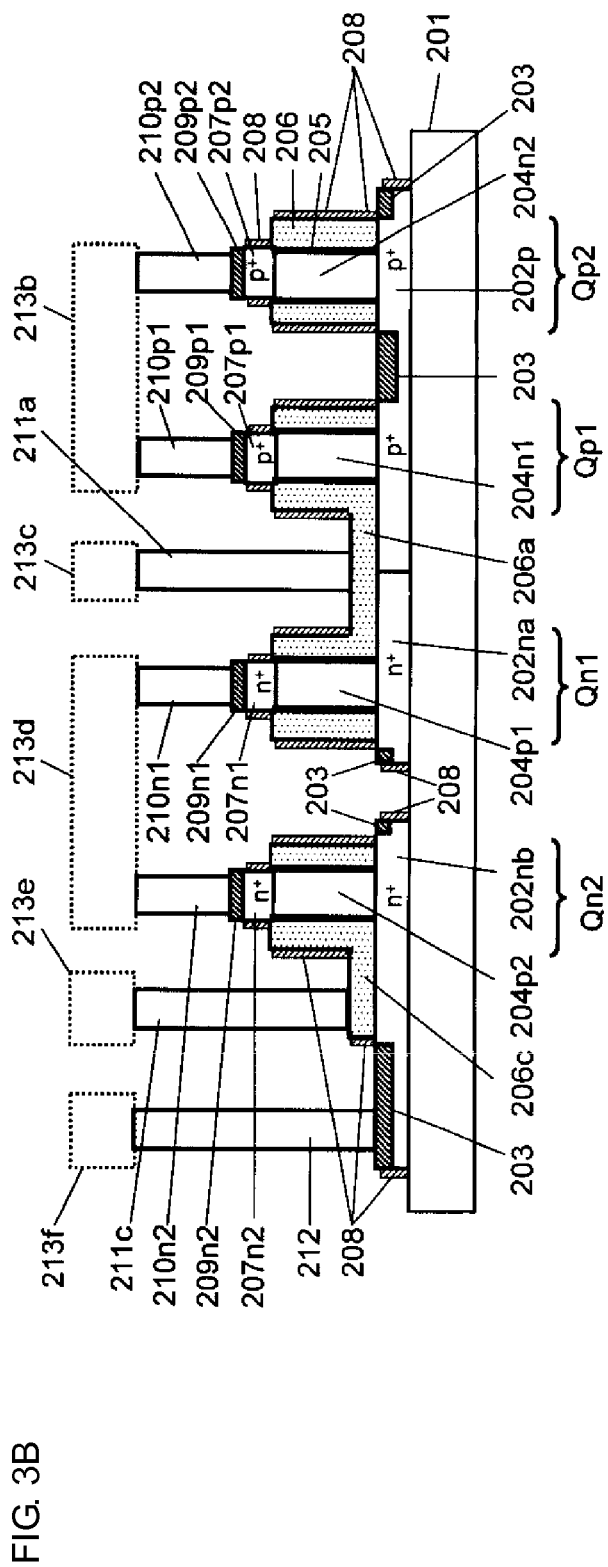
FIG. 3B is a cross-sectional view of the NAND circuit according to the second embodiment of the present invention.

FIGS. 3A and 3B illustrate a second embodiment. FIG. 3A is a plan view illustrating the layout (arrangement) of a two-input NAND circuit according to the present invention, and FIG. 3B is a cross-sectional view taken along a cut line A-A'.

Referring to FIG. 3A, the PMOS transistors Qp2 and Qp1 and the NMOS transistors Qn1 and Qn2 of the NAND circuit illustrated in FIG. 1 are arranged in a line from the right. In FIGS. 3A and 3B, the components having the same structure as that in FIGS. 2A and 2B are denoted by equivalent reference numerals in the 200s.

Planar silicon layers 202p, 202na, and 202nb are disposed on an insulating film, such as a buried oxide (BOX) layer 201 disposed on a substrate. The planar silicon layers 202p, 202na, and 202nb are formed of a p+ diffusion layer, an n+ diffusion layer, and an n+ diffusion layer, respectively, through impurity implantation or the like, and serve as lower diffusion layers. 203 denotes a silicide layer disposed on surfaces of the planar silicon layers 202p, 202na, and 202nb, which connects the planar silicon layers 202p and 202na to each other. 204n1 and 204n2 denote n-type silicon pillars; 204p1 and 204p2 denote p-type silicon pillars; 205 denotes a gate insulating film surrounding the silicon pillars 204n1, 204n2, 204p1, and 204p2; 206 denotes a gate electrode; and 206a, 206b, and 206c denote gate lines. P+ diffusion layers 207p1 and 207p2 are formed at the tops of the n-type silicon pillars 204n1 and 204n2, respectively, through impurity implantation or the like, and serve as upper diffusion layers. N+ diffusion layers 207n1 and 207n2 are formed at the tops of the p-type silicon pillars 204p1 and 204p2, respectively, through impurity implantation or the like, and serve as upper diffusion layers. 208 denotes a silicon nitride film for protecting the gate insulating film 205; 209p1, 209p2, 209n1, and 209n2 denote silicide layers connected to the p+ diffusion layers 207p1 and 207p2 and the n+ diffusion layers 207n1 and 207n2, respectively; 210p1, 210p2, 210n1, and 210n2 denote contacts that connect the silicide layers 209p1, 209p2, 209n1, and 209n2 to first metal lines 213b, 213b, 213d, and 213d, respectively; 211a denotes a contact that connects the gate line 206a and a first metal line 213c to each other; and 211c denotes a contact that connects the gate line 206c and a first metal line 213e to each other. 212 denotes a contact that connects the silicide layer 203 connected to the planar silicon layer 202nb and a first metal line 213f to each other. The gate line 206b is a line that connects the gate electrode 206 of the PMOS transistor Qp2 and the gate electrode 206 of the NMOS transistor Qn2 to each other, which will be described below.

The n-type silicon pillar 204n1, the planar silicon layer 202p, the p+ diffusion layer 207p1, the gate insulating film 205, and the gate electrode 206 constitute the PMOS transistor Qp1. The n-type silicon pillar 204n2, the planar silicon layer 202p, the p+ diffusion layer 207p2, the gate insulating film 205, and the gate electrode 206 constitute the PMOS transistor Qp2. The p-type silicon pillar 204p1, the planar silicon layer 202na, the n+ diffusion layer 207n1, the gate insulating film 205, and the gate electrode 206 constitute the NMOS transistor Qn1. The p-type silicon pillar 204p2, the planar silicon layer 202nb, the n+ diffusion layer 207n2, the gate insulating film 205, and the gate electrode 206 constitute the NMOS transistor Qn2.

The gate line 206a is connected to the gate electrode 206 of the PMOS transistor Qp1. The gate line 206b is connected to the gate electrode 206 of the PMOS transistor Qp2. The gate line 206a is connected to the gate electrode 206 of the NMOS transistor Qn1. The gate lines 206b and 206c are connected to the gate electrode 206 of the NMOS transistor Qn2.

The planar silicon layers 202p and 202na serve as a common drain of the PMOS transistors Qp1 and Qp2 and the NMOS transistor Qn1, and are connected to an output OUT1. The p+ diffusion layer 207p1, which serves as the source of the PMOS transistor Qp1, is connected to the first metal line 213b via the silicide layer 209p1 and the contact 210p1, and the power supply voltage Vcc is supplied to the first metal line 213b. The p+ diffusion layer 207p2, which serves as the source of the PMOS transistor Qp2, is connected to the first metal line 213b via the silicide layer 209p2 and the contact 210p2. The n+ diffusion layer 207n1, which serves as the source of the NMOS transistor Qn1, is connected to the first metal line 213d via the silicide layer 209n1 and the contact 210n1.

The n+ diffusion layer 207n2, which serves as the drain of the NMOS transistor Qn2, is connected to the first metal line 213d via the silicide layer 209n2 and the contact 210n2. Here, the n+ diffusion layer 207n1, which serves as the source of the NMOS transistor Qn1, and the n+ diffusion layer 207n2, which serves as the drain of the NMOS transistor Qn2, are connected to each other via the first metal line 213d. The planar silicon layer 202nb serves as the source of the NMOS transistor Qn2, and is connected to the first metal line 213f via the silicide layer 203 and the contact 212. The reference voltage Vss is supplied to the first metal line 213f.

The input signal IN1 is supplied to the first metal line 213c, is supplied to the gate line 206a via the contact 211a, and is supplied to the gate electrodes of the PMOS transistor Qp1 and the NMOS transistor Qn1. The input signal IN2 is supplied to first metal line 213e, is supplied to the gate line 206c via the contact 211c, and is supplied to the gate electrode of the NMOS transistor Qn2. Also, the input signal IN2 is supplied to the gate electrode of the PMOS transistor Qp2 via the gate line 206b. In this embodiment, the gate electrodes of the NMOS transistor Qn2 and the PMOS transistor Qp2 are connected to each other by using the extended gate line 206b in order to omit a metal line. However, the gate line 206b extends between diffusion layers in a free region, and thus an increase in the area does not occur.

According to this embodiment, four SGTs constituting a two-input NAND circuit can be arranged in a line without providing wasteful lines and contact regions, and a semiconductor device with a reduced area can be provided. Further, with the gate line 206b being extended, connections can be made using only the first metal lines, and thus the second metal line can be effectively used. Further, the first metal line 213b for the power supply voltage Vcc is disposed at the right end and the first metal line 213f for the reference voltage Vss is disposed at the left end. Accordingly, the power supply can be shared in a case where a plurality of circuits are arranged side by side, and thus the area can be further reduced.

Third Embodiment

Figure 4A:
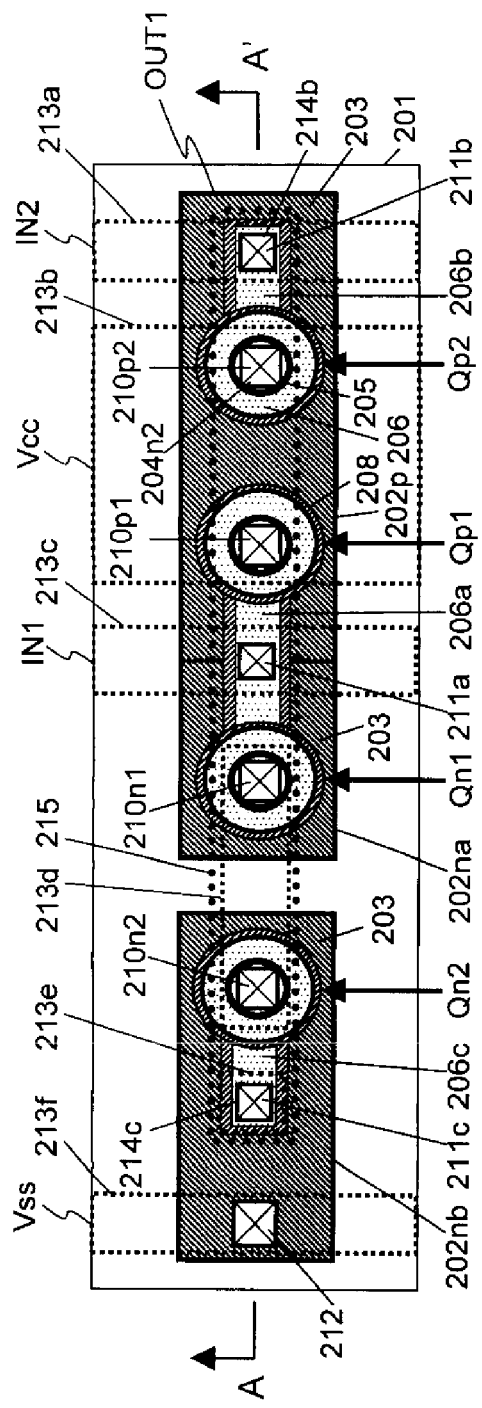
FIG. 4A is a plan view of a NAND circuit according to a third embodiment of the present invention.
Figure 4B:
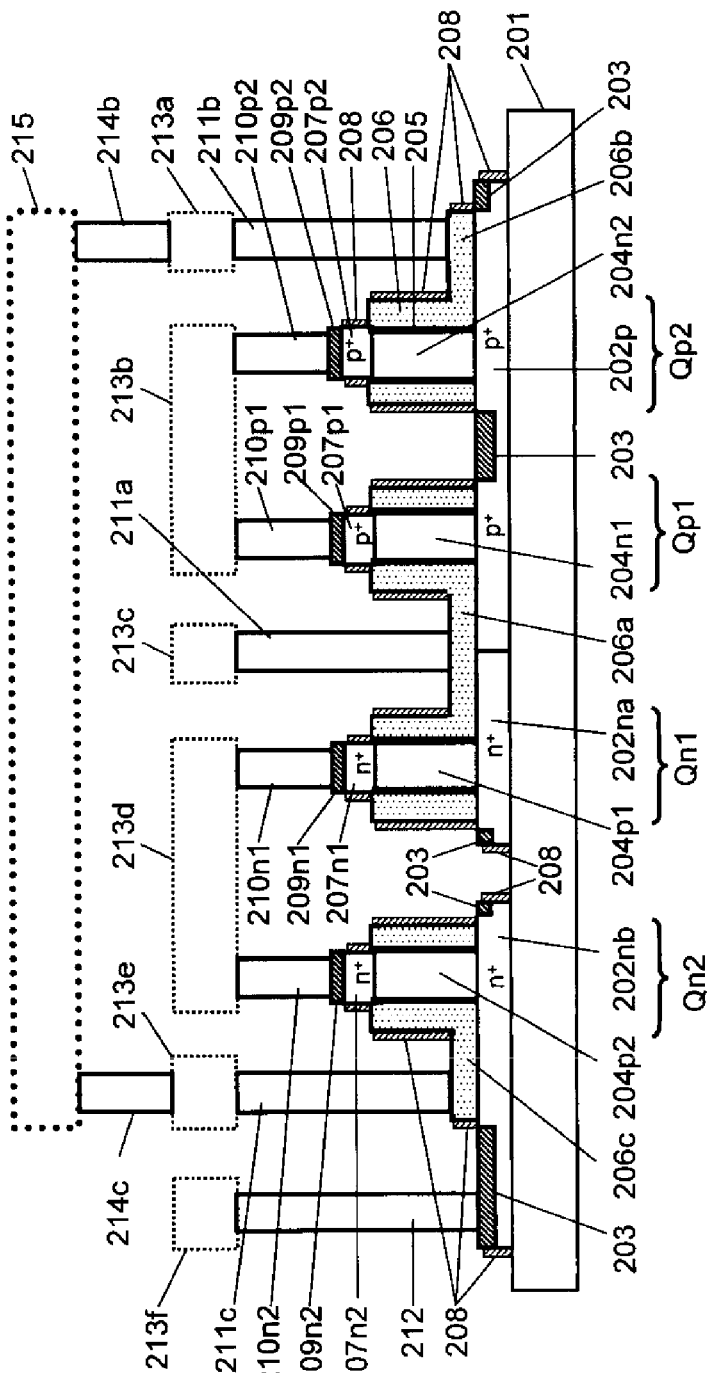
FIG. 4B is a cross-sectional view of the NAND circuit according to the third embodiment of the present invention.

FIGS. 4A and 4B illustrate a third embodiment. FIG. 4A is a plan view illustrating the layout (arrangement) of a two-input NAND circuit according to the present invention, and FIG. 4B is a cross-sectional view taken along a cut line A-A'.

The arrangement of the transistors illustrated in FIGS. 4A and 4B is the same as that illustrated in FIGS. 3A and 3B, that is, the PMOS transistors Qp2 and Qp1 and the NMOS transistors Qn1 and Qn2 are arranged in a line from the right. A difference from FIGS. 3A and 3B is a connection method for a gate input signal between the PMOS transistor Qp2 and the NMOS transistor Qn2. In FIGS. 4A and 4B, the components having the same structure as that in FIGS. 3A and 3B are denoted by equivalent reference numerals in the 200s.

Planar silicon layers 202p, 202na, and 202nb are disposed on an insulating film, such as a buried oxide (BOX) layer 201 disposed on a substrate. The planar silicon layers 202p, 202na, and 202nb are formed of a p+ diffusion layer, an n+ diffusion layer, and an n+ diffusion layer, respectively, through impurity implantation or the like, and serve as lower diffusion layers. 203 denotes a silicide layer disposed on surfaces of the planar silicon layers 202p, 202na, and 202nb, which connects the planar silicon layers 202p and 202na to each other. 204n1 and 204n2 denote n-type silicon pillars; 204p1 and 204p2 denote p-type silicon pillars; 205 denotes a gate insulating film surrounding the silicon pillars 204n1, 204n2, 204p1, and 204p2; 206 denotes a gate electrode; and 206a, 206b, and 206c denote gate lines. P+ diffusion layers 207p1 and 207p2 are formed at the tops of the n-type silicon pillars 204n1 and 204n2, respectively, through impurity implantation or the like, and serve as upper diffusion layers. N+ diffusion layers 207n1 and 207n2 are formed at the tops of the p-type silicon pillars 204p1 and 204p2, respectively, through impurity implantation or the like, and serve as upper diffusion layers. 208 denotes a silicon nitride film for protecting the gate insulating film 205; 209p1, 209p2, 209n1, and 209n2 denote silicide layers connected to the p+ diffusion layers 207p1 and 207p2 and the n+ diffusion layers 207n1 and 207n2, respectively; 210p1, 210p2, 210n1, and 210n2 denote contacts that connect the silicide layers 209p1, 209p2, 209n1, and 209n2 to first metal lines 213b, 213b, 213d, and 213d, respectively; 211a denotes a contact that connects the gate line 206a and a first metal line 213c to each other; 211b denotes a contact that connects the gate line 206b and a first metal line 213a to each other; and 211c denotes a contact that connects the gate line 206c and a first metal line 213e to each other. 214b denotes a contact that connects the first metal line 213a and a second metal line 215 to each other; and 214c denotes a contact that connects the first metal line 213e and the second metal line 215 to each other. 212 denotes a contact that connects the silicide layer 203 connected to the planar silicon layer 202nb and a first metal line 213f to each other.

The n-type silicon pillar 204n1, the planar silicon layer 202p, the p+ diffusion layer 207p1, the gate insulating film 205, and the gate electrode 206 constitute the PMOS transistor Qp1. The n-type silicon pillar 204n2, the planar silicon layer 202p, the p+ diffusion layer 207p2, the gate insulating film 205, and the gate electrode 206 constitute the PMOS transistor Qp2. The p-type silicon pillar 204p1, the planar silicon layer 202na, the n+ diffusion layer 207n1, the gate insulating film 205, and the gate electrode 206 constitute the NMOS transistor Qn1. The p-type silicon pillar 204p2, the planar silicon layer 202nb, the n+ diffusion layer 207n2, the gate insulating film 205, and the gate electrode 206 constitute the NMOS transistor Qn2.

The gate line 206a is connected to the gate electrode 206 of the PMOS transistor Qp1. The gate line 206b is connected to the gate electrode 206 of the PMOS transistor Qp2. The gate line 206a is connected to the gate electrode 206 of the NMOS transistor Qn1. The gate line 206c is connected to the gate electrode 206 of the NMOS transistor Qn2.

The planar silicon layers 202p and 202na serve as a common drain of the PMOS transistors Qp1 and Qp2 and the NMOS transistor Qn1, and are connected to an output OUT1. The p+ diffusion layer 207p1, which serves as the source of the PMOS transistor Qp1, is connected to the first metal line 213b via the silicide layer 209p1 and the contact 210p1, and the power supply voltage Vcc is supplied to the first metal line 213b. The p+ diffusion layer 207p2, which serves as the source of the PMOS transistor Qp2, is connected to the first metal line 213b via the silicide layer 209p2 and the contact 210p2. The n+ diffusion layer 207n1, which serves as the source of the NMOS transistor Qn1, is connected to the first metal line 213d via the silicide layer 209n1 and the contact 210n1.

The n+ diffusion layer 207n2, which serves as the drain of the NMOS transistor Qn2, is connected to the first metal line 213d via the silicide layer 209n2 and the contact 210n2. Here, the source of the NMOS transistor Qn1 and the drain of the NMOS transistor Qn2 are connected to each other via the first metal line 213d. The planar silicon layer 202nb serves as the source of the NMOS transistor Qn2 and is connected to the first metal line 213f via the silicide layer 203 and the contact 212. The reference voltage Vss is supplied to the first metal line 213f.

The input signal IN1 is supplied to the first metal line 213c, is supplied to the gate line 206a via the contact 211a, and is supplied to the gate electrodes of the PMOS transistor Qp1 and the NMOS transistor Qn1. The input signal IN2 is supplied to the first metal line 213a, is supplied to the gate line 206b via the contact 211b, and is supplied to the gate electrode 206 of the PMOS transistor Qp2. Also, the input signal IN2 is supplied to the second metal line 215 via the contact 214b, is supplied to the gate line 206c via the contact 214c, the first metal line 213e, and the contact 211c, and is supplied to the gate electrode 206 of the NMOS transistor Qn2.

According to this embodiment, four SGTs constituting a two-input NAND circuit can be arranged in a line without providing wasteful lines and contact regions, and a semiconductor device with a reduced area can be provided. Further, with use of the second metal line, the gate line 206b according to the second embodiment can be omitted.

Fourth Embodiment

Figure 5A:
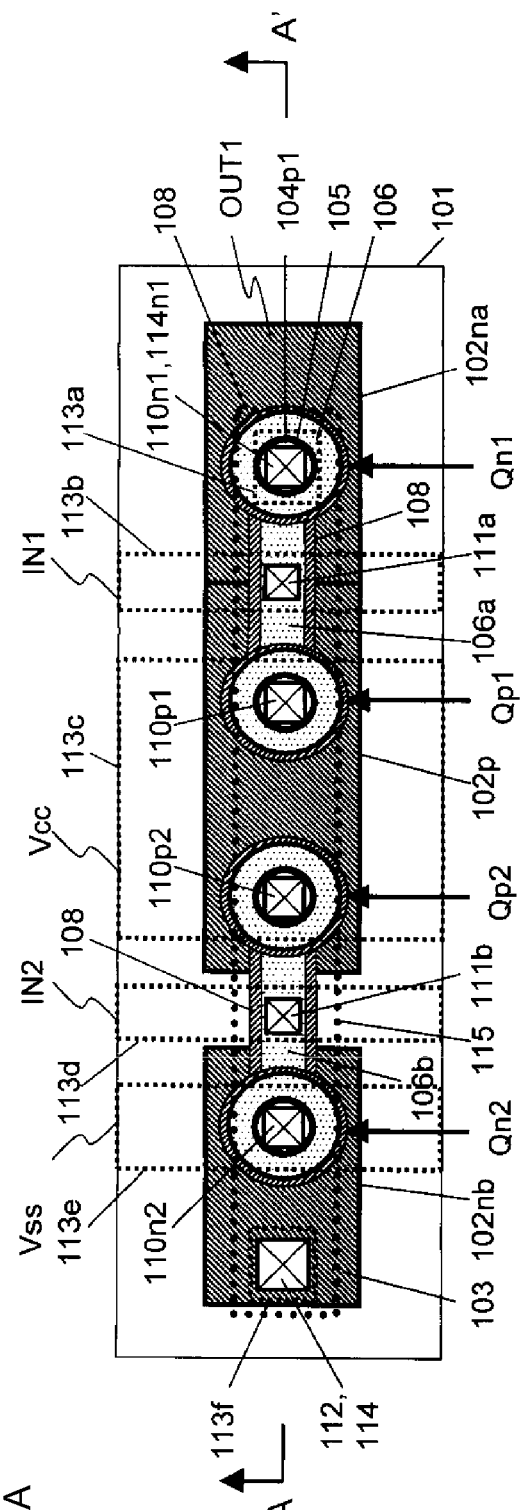
FIG. 5A is a plan view of a NAND circuit according to a fourth embodiment of the present invention.
Figure 5B:
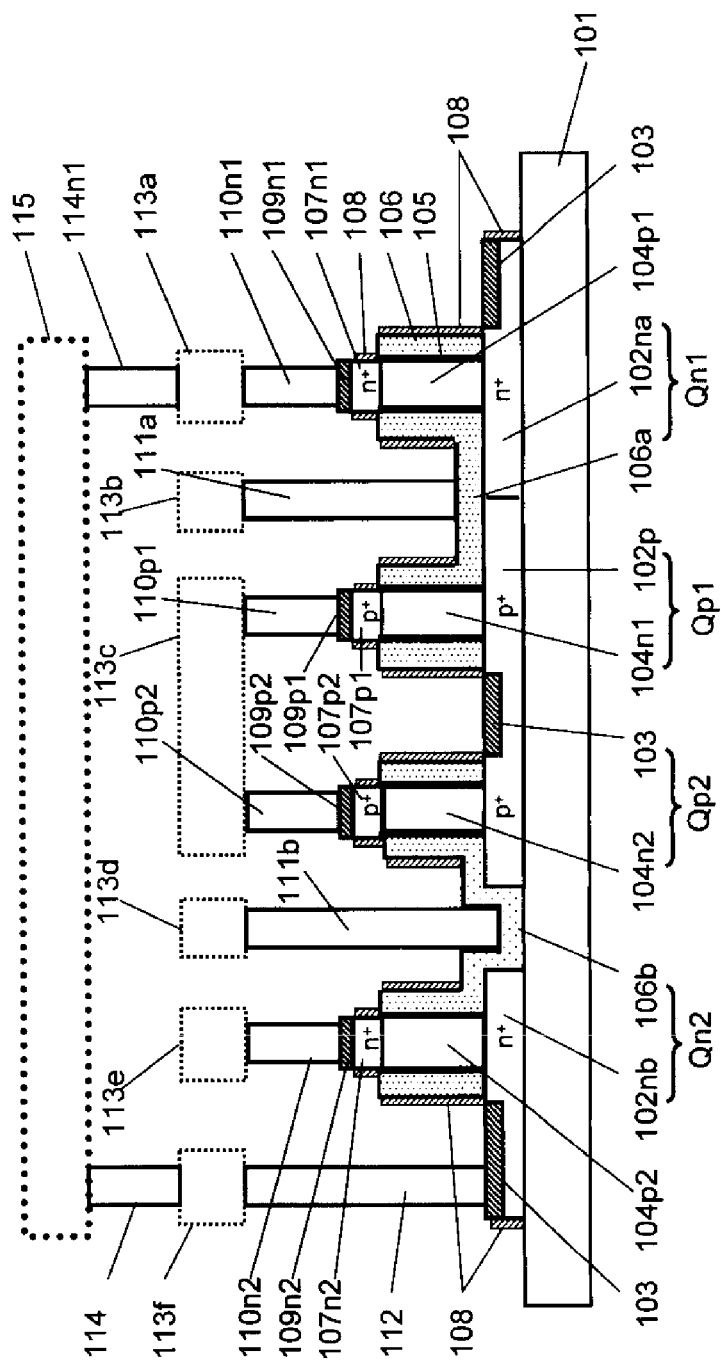
FIG. 5B is a cross-sectional view of the NAND circuit according to the fourth embodiment of the present invention.

FIGS. 5A and 5B illustrate a fourth embodiment. FIG. 5A is a plan view illustrating the layout (arrangement) of a two-input NAND circuit according to the present invention, and FIG. 5B is a cross-sectional view taken along a cut line A-A'.

The arrangement of the transistors illustrated in FIGS. 5A and 5B is the same as that illustrated in FIGS. 2A and 2B, that is, the NMOS transistor Qn1, the PMOS transistors Qp1 and Qp2, and the NMOS transistor Qn2 are arranged in a line from the right. A difference from FIGS. 2A and 2B is that the connection of the source and drain of the NMOS transistor Qn2 is changed. In FIGS. 5A and 5B, the components having the same structure as that in FIGS. 2A and 2B are denoted by equivalent reference numerals in the 100s.

In an SGT, the drain and source are located in a lower layer portion and an upper layer portion, respectively, and the physical positions thereof are different. The drain and source are made so as to be as equivalent as possible, but the orientations of the drain and source are different and thus both of them may have different current characteristics in some cases. The present invention addresses this issue.

Planar silicon layers 102na, 102p, and 102nb are disposed on an insulating film, such as a buried oxide (BOX) layer 101 disposed on a substrate. The planar silicon layers 102na, 102p, and 102nb are formed of an n+ diffusion layer, a p+ diffusion layer, and an n+ diffusion layer, respectively, through impurity implantation or the like, and serve as lower diffusion layers. 103 denotes a silicide layer disposed on surfaces of the planar silicon layers 102na, 102p, and 102nb, which connects the planar silicon layers 102na and 102p to each other. 104n1 and 104n2 denote n-type silicon pillars; 104p1 and 104p2 denote p-type silicon pillars; 105 denotes a gate insulating film surrounding the silicon pillars 104n1, 104n2, 104p1, and 104p2; 106 denotes a gate electrode; and 106a and 106b denote gate lines. P+ diffusion layers 107p1 and 107p2 are formed at the tops of the n-type silicon pillars 104n1 and 104n2, respectively, through impurity implantation or the like, and serve as upper diffusion layers. N+ diffusion layers 107n1 and 107n2 are formed at the tops of the p-type silicon pillars 104p1 and 104p2, respectively, through impurity implantation or the like, and serve as upper diffusion layers. 108 denotes a silicon nitride film for protecting the gate insulating film 105; 109p1, 109p2, 109n1, and 109n2 denote silicide layers connected to the p+ diffusion layers 107p1 and 107p2 and the n+ diffusion layers 107n1 and 107n2 , respectively; 110p1, 110p2, 110n1, and 110n2 denote contacts that connect the silicide layers 109p1, 109p2, 109n1, and 109n2 to first metal lines 113c, 113c, 113a, and 113e, respectively; 111a denotes a contact that connects the gate line 106a and a first metal line 113b to each other; and 111b denotes a contact that connects the gate line 106b and a first metal line 113d to each other. 112 denotes a contact that connects the silicide layer 103 connected to the planar silicon layer 102nb and a first metal line 113f to each other. 114n1 denotes a contact that connects the first metal line 113a and a second metal line 115 to each other; and 114 denotes a contact that connects the first metal line 113f and the second metal line 115 to each other.

The n-type silicon pillar 104n1, the planar silicon layer 102p, the p+ diffusion layer 107p1 , the gate insulating film 105, and the gate electrode 106 constitute the PMOS transistor Qp1. The n-type silicon pillar 104n2, the planar silicon layer 102p, the p+ diffusion layer 107p2 , the gate insulating film 105, and the gate electrode 106 constitute the PMOS transistor Qp2. The p-type silicon pillar 104p1, the planar silicon layer 102na, the n+ diffusion layer 107n1 , the gate insulating film 105, and the gate electrode 106 constitute the NMOS transistor Qn1. The p-type silicon pillar 104p2, the planar silicon layer 102nb , the n+ diffusion layer 107n2 , the gate insulating film 105, and the gate electrode 106 constitute the NMOS transistor Qn2.

The gate line 106a is connected to the gate electrode 106 of the PMOS transistor Qp1. The gate line 106b is connected to the gate electrode 106 of the PMOS transistor Qp2. The gate line 106a is connected to the gate electrode 106 of the NMOS transistor Qn1. The gate line 106b is connected to the gate electrode 106 of the NMOS transistor Qn2.

The planar silicon layers 102na and 102p serve as a common drain of the NMOS transistor Qn1 and the PMOS transistors Qp1 and Qp2, and are connected to an output OUT1. The p+ diffusion layer 107p1 , which serves as the source of the PMOS transistor Qp1, is connected to the first metal line 113c via the silicide layer 109p1 and the contact 110p1, and the power supply voltage Vcc is supplied to the first metal line 113c. The p+ diffusion layer 107p2 , which serves as the source of the PMOS transistor Qp2, is connected to the first metal line 113c via the silicide layer 109p2 and the contact 110p2. The n+ diffusion layer 107n1 , which serves as the source of the NMOS transistor Qn1, is connected to the first metal line 113a via the silicide layer 109n1 and the contact 110n1, and the first metal line 113a is connected to the second metal line 115 via the contact 114n1. The planar silicon layer 102nb , which serves as the drain of the NMOS transistor Qn2, is connected to the second metal line 115 via the silicide layer 103, the contact 112, the first metal line 113f, and the contact 114, and the n+ diffusion layer 107n1 , which serves as the source of the NMOS transistor Qn1, and the planar silicon layer 102nb , which serves as the drain of the NMOS transistor Qn2, are connected to each other via the second metal line 115. The n+ diffusion layer 107n2 , which serves as the source of the NMOS transistor Qn2, is connected to the first metal line 113e via the silicide layer 109n2 and the contact 110n2, and the reference voltage Vss is supplied to the first metal line 113e. With such connections, the orientations of the drains and sources of the NMOS transistors Qn1 and Qn2 can be the same, that is, the directions in which currents flow therethrough can be the same, and accordingly the same current characteristic can be obtained.

The input signal IN1 is supplied to the first metal line 113b, is supplied to the gate line 106a via the contact 111a, and is supplied to the gate electrodes of the PMOS transistor Qp1 and the NMOS transistor Qn1. The input signal IN2 is supplied to the first metal line 113d, is supplied to the gate line 106b via the contact 111b, and is supplied to the gate electrodes of the PMOS transistor Qp2 and the NMOS transistor Qn2.

According to this embodiment, four SGTs constituting a two-input NAND circuit can be arranged in a line without providing wasteful lines and contact regions, and a semiconductor device with a reduced area can be provided. Further, the current flow directions of the NMOS transistor Qn1 and the NMOS transistor Qn2 (the orientations of the drains and sources) can be the same. Accordingly, the same current characteristic can be obtained and a favorable characteristic can be obtained.

Fifth Embodiment

Figure 6A:
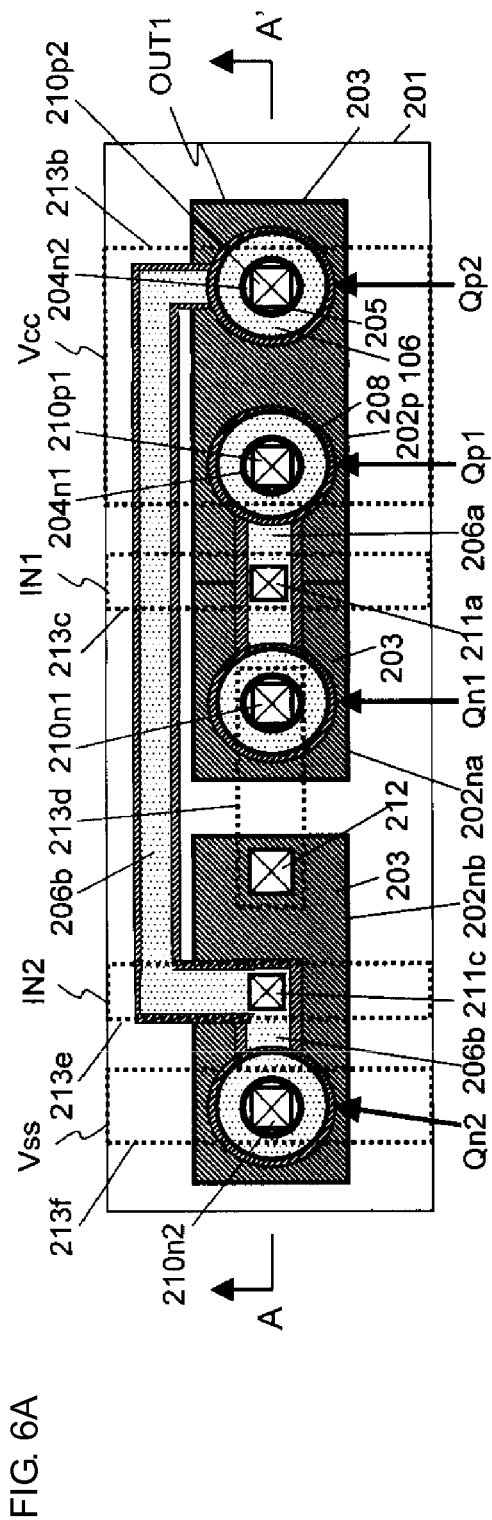
FIG. 6A is a plan view of a NAND circuit according to a fifth embodiment of the present invention.
Figure 6B:
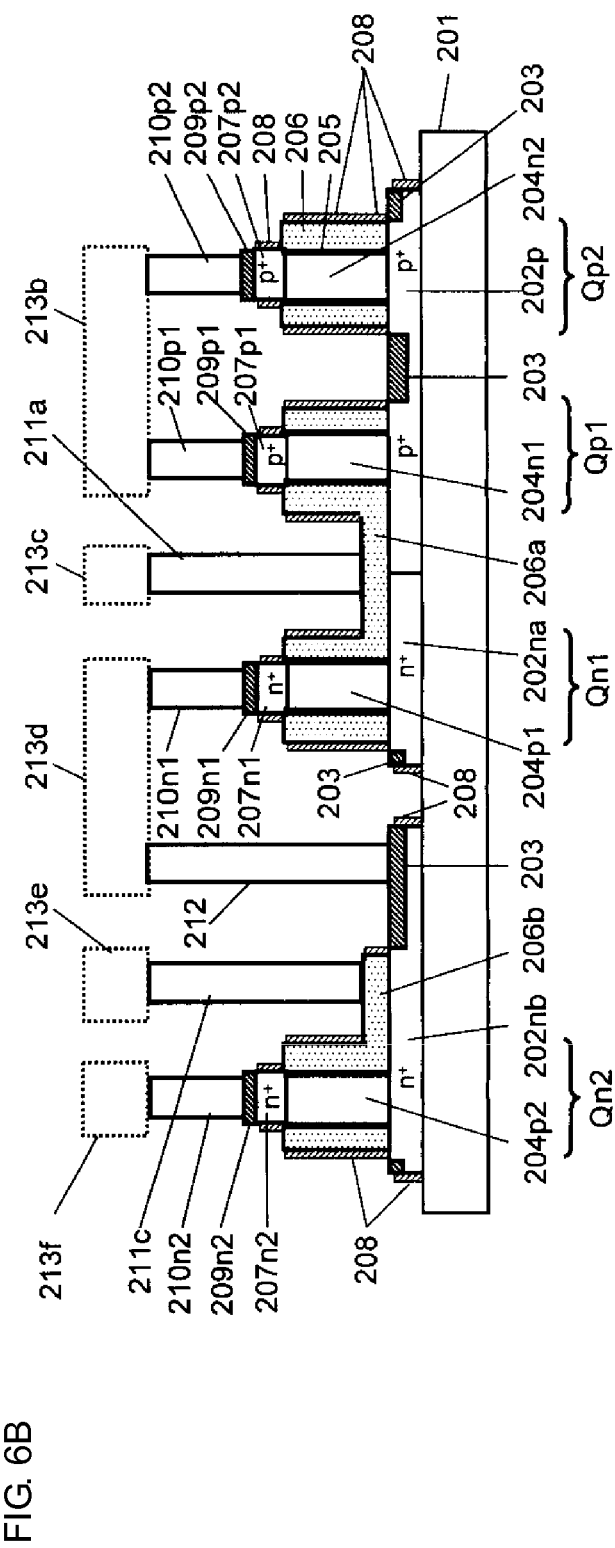
FIG. 6B is a cross-sectional view of the NAND circuit according to the fifth embodiment of the present invention.

FIGS. 6A and 6B illustrate a fifth embodiment. FIG. 6A is a plan view illustrating the layout (arrangement) of a two-input NAND circuit according to the present invention, and FIG. 6B is a cross-sectional view taken along a cut line A-A'.

The arrangement of the transistors illustrated in FIGS. 6A and 6B is the same as that illustrated in FIGS. 3A and 3B, that is, the PMOS transistors Qp2 and Qp1 and the NMOS transistors Qn1 and Qn2 are arranged in a line from the right. A difference from FIGS. 3A and 3B is that the connection of the source and drain of the NMOS transistor Qn2 is changed. In FIGS. 6A and 6B, the components having the same structure as that in FIGS. 3A and 3B are denoted by equivalent reference numerals in the 200s.

In an SGT, the drain and source are located in a lower layer portion and an upper layer portion, respectively, and the physical positions thereof are different. The drain and source are made so as to be as equivalent as possible, but the orientations of the drain and source are different and thus both of them may have different current characteristics in some cases. The present invention addresses this issue.

Planar silicon layers 202p, 202na, and 202nb are disposed on an insulating film, such as a buried oxide (BOX) layer 201 disposed on a substrate. The planar silicon layers 202p, 202na, and 202nb are formed of a p+ diffusion layer, an n+ diffusion layer, and an n+ diffusion layer, respectively, through impurity implantation or the like, and serve as lower diffusion layers. 203 denotes a silicide layer disposed on surfaces of the planar silicon layers 202p, 202na, and 202nb, which connects the planar silicon layers 202p and 202na to each other. 204n1 and 204n2 denote n-type silicon pillars; 204p1 and 204p2 denote p-type silicon pillars; 205 denotes a gate insulating film surrounding the silicon pillars 204n1, 204n2, 204p1, and 204p2; 206 denotes a gate electrode; and 206a and 206b denote gate lines. P+ diffusion layers 207p1 and 207p2 are formed at the tops of the n-type silicon pillars 204n1 and 204n2, respectively, through impurity implantation or the like, and serve as upper diffusion layers. N+ diffusion layers 207n1 and 207n2 are formed at the tops of the p-type silicon pillars 204p1 and 204p2, respectively, through impurity implantation or the like, and serve as upper diffusion layers. 208 denotes a silicon nitride film for protecting the gate insulating film 205; 209p1, 209p2, 209n1, and 209n2 denote silicide layers connected to the p+ diffusion layers 207p1 and 207p2 and the n+ diffusion layers 207n1 and 207n2, respectively; 210p1, 210p2, 210n1, and 210n2 denote contacts that connect the silicide layers 209p1, 209p2, 209n1, and 209n2 to first metal lines 213b, 213b, 213d, and 213f, respectively; 211a denotes a contact that connects the gate line 206a and a first metal line 213c to each other; and 211c denotes a contact that connects the gate line 206b and a first metal line 213e to each other. 212 denotes a contact that connects the silicide layer 203 connected to the planar silicon layer 202nb and the first metal line 213d to each other. The gate line 206b is a line that connects the gate electrode 206 of the PMOS transistor Qp2 and the gate electrode 206 of the NMOS transistor Qn2 to each other, which will be described below.

The n-type silicon pillar 204n1, the planar silicon layer 202p, the p+ diffusion layer 207p1, the gate insulating film 205, and the gate electrode 206 constitute the PMOS transistor Qp1. The n-type silicon pillar 204n2, the planar silicon layer 202p, the p+ diffusion layer 207p2, the gate insulating film 205, and the gate electrode 206 constitute the PMOS transistor Qp2. The p-type silicon pillar 204p1, the planar silicon layer 202na, the n+ diffusion layer 207n1, the gate insulating film 205, and the gate electrode 206 constitute the NMOS transistor Qn1. The p-type silicon pillar 204p2, the planar silicon layer 202nb, the n+ diffusion layer 207n2, the gate insulating film 205, and the gate electrode 206 constitute the NMOS transistor Qn2.

The gate line 206a is connected to the gate electrode 206 of the PMOS transistor Qp1. The gate line 206b is connected to the gate electrode 206 of the PMOS transistor Qp2. The gate line 206a is connected to the gate electrode 206 of the NMOS transistor Qn1. The gate line 206b is connected to the gate electrode 206 of the NMOS transistor Qn2.

The planar silicon layers 202p and 202naserve as a common drain of the PMOS transistors Qp1 and Qp2 and the NMOS transistor Qn1, and are connected to an output OUT1. The p+ diffusion layer 207p1, which serves as the source of the PMOS transistor Qp1, is connected to the first metal line 213b via the silicide layer 209p1 and the contact 210p1, and the power supply voltage Vcc is supplied to the first metal line 213b. The p+ diffusion layer 207p2, which serves as the source of the PMOS transistor Qp2, is connected to the first metal line 213b via the silicide layer 209p2 and the contact 210p2. The n+ diffusion layer 207n1, which serves as the source of the NMOS transistor Qn1, is connected to the first metal line 213d via the silicide layer 209n1 and the contact 210n1.

The planar silicon layer 202nb, which serves as the drain of the NMOS transistor Qn2, is connected to the first metal line 213d via the silicide layer 203 and the contact 212. Here, the n+ diffusion layer 207n1, which serves as the source of the NMOS transistor Qn1, and the planar silicon layer 202nb, which serves as the drain of the NMOS transistor Qn2, are connected to each other via the first metal line 213d. The n+ diffusion layer 207n2 of the NMOS transistor Qn2 serves as the source and is connected to the first metal line 213f via the silicide layer 209n2 and the contact 210n2. The reference voltage Vss is supplied to the first metal line 213f.

The input signal IN1 is supplied to the first metal line 213c, is supplied to the gate line 206a via the contact 211a, and is supplied to the gate electrodes of the PMOS transistor Qp1 and the NMOS transistor Qn1. The input signal IN2 is supplied to the first metal line 213e, is supplied to the gate line 206b via the contact 211c, and is supplied to the gate electrode of the NMOS transistor Qn2. The gate line 206b is connected to the gate electrode of the PMOS transistor Qp2.

According to this embodiment, four SGTs constituting a two-input NAND circuit can be arranged in a line without providing wasteful lines and contact regions, and a semiconductor device with a reduced area can be provided. Further, connections can be made using only the first metal lines, and the second metal line can be effectively used. Further, the current flow directions of the NMOS transistor Qn1 and the NMOS transistor Qn2 (the orientations of the drains and sources) can be the same. Accordingly, the same current characteristic can be obtained and a favorable characteristic can be obtained.

Sixth Embodiment

Figure 7A:
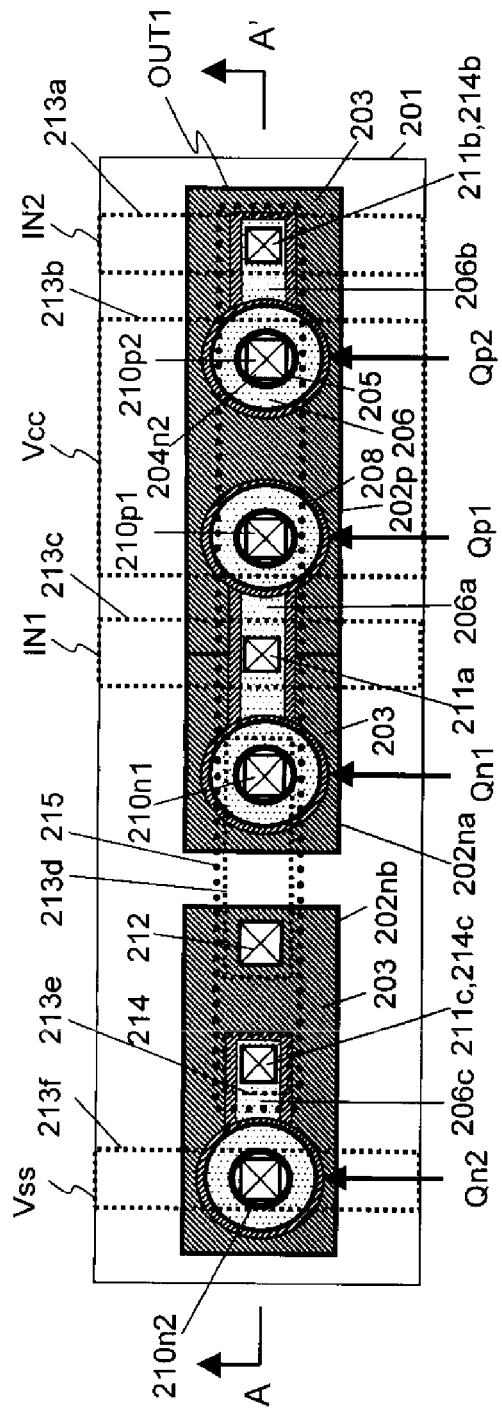
FIG. 7A is a plan view of a NAND circuit according to a sixth embodiment of the present invention.
Figure 7B:
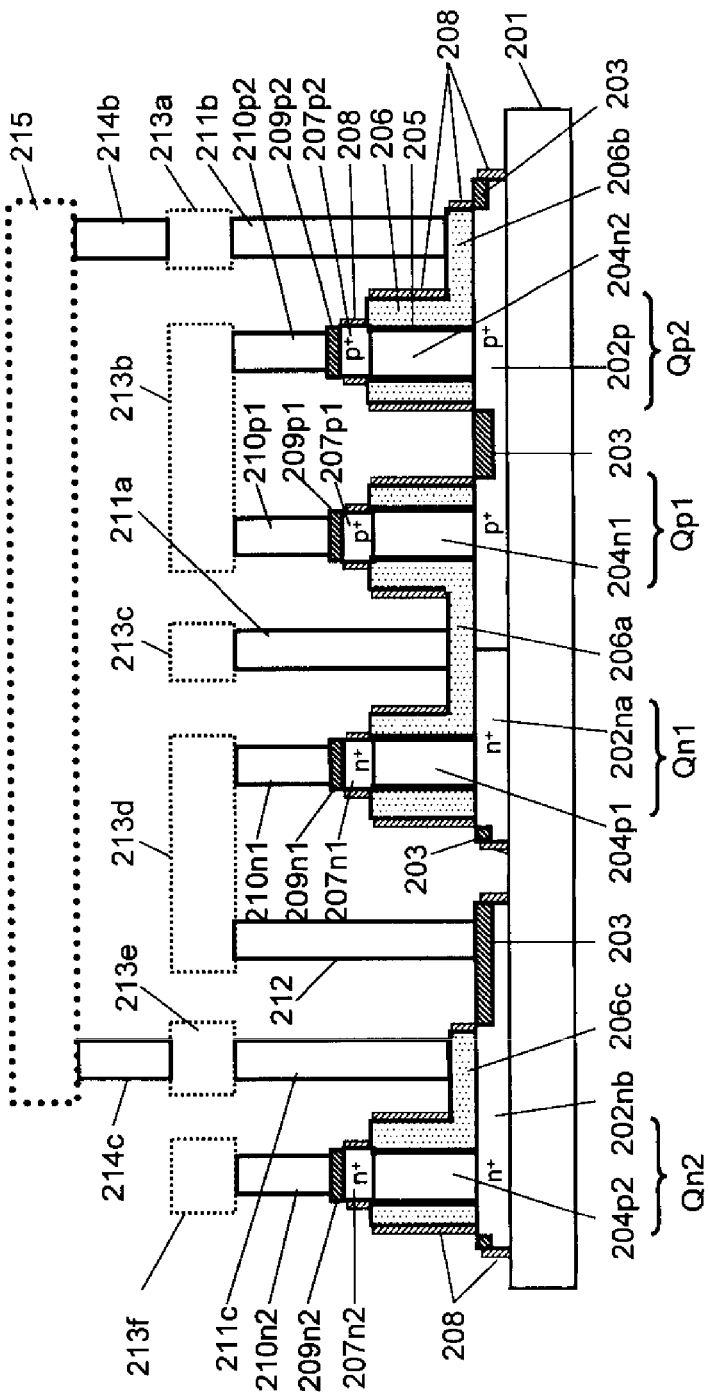
FIG. 7B is a cross-sectional view of the NAND circuit according to the sixth embodiment of the present invention.

FIGS. 7A and 7B illustrate a sixth embodiment. FIG. 7A is a plan view illustrating the layout (arrangement) of a two-input NAND circuit according to the present invention, and FIG. 7B is a cross-sectional view taken along a cut line A-A'.

The arrangement of the transistors illustrated in FIGS. 7A and 7B is the same as that illustrated in FIGS. 4A and 4B, that is, the PMOS transistors Qp2 and Qp1 and the NMOS transistors Qn1 and Qn2 are arranged in a line from the right. A difference from FIGS. 4A and 4B is that the connection of the source and drain of the NMOS transistor Qn2 is changed. In FIGS. 7A and 7B, the components having the same structure as that in FIGS. 4A and 4B are denoted by equivalent reference numerals in the 200s.

In an SGT, the drain and source are located in a lower layer portion and an upper layer portion, respectively, and the physical positions thereof are different. The drain and source are made so as to be as equivalent as possible, but the orientations of the drain and source are different and thus both of them may have different current characteristics in some cases. The present invention addresses this issue.

Planar silicon layers 202p, 202na, and 202nb are disposed on an insulating film, such as a buried oxide (BOX) layer 201 disposed on a substrate. The planar silicon layers 202p, 202na, and 202nb are formed of a p+ diffusion layer, an n+ diffusion layer, and an n+ diffusion layer, respectively, through impurity implantation or the like, and serve as lower diffusion layers. 203 denotes a silicide layer disposed on surfaces of the planar silicon layers 202p, 202na, and 202nb, which connects the planar silicon layers 202p and 202nato each other. 204n1 and 204n2 denote n-type silicon pillars; 204p1 and 204p2 denote p-type silicon pillars; 205 denotes a gate insulating film surrounding the silicon pillars 204n1, 204n2, 204p1, and 204p2; 206 denotes a gate electrode; and 206a, 206b, and 206c denote gate lines. P+ diffusion layers 207p1 and 207p2 are formed at the tops of the n-type silicon pillars 204n1 and 204n2, respectively, through impurity implantation or the like, and serve as upper diffusion layers. N+ diffusion layers 207n1 and 207n2 are formed at the tops of the p-type silicon pillars 204p1 and 204p2, respectively, through impurity implantation or the like, and serve as upper diffusion layers. 208 denotes a silicon nitride film for protecting the gate insulating film 205; 209p1, 209p2, 209n1, and 209n2 denote silicide layers connected to the p+ diffusion layers 207p1 and 207p2 and the n+ diffusion layers 207n1 and 207n2, respectively; 210p1, 210p2, 210n1, and 210n2 denote contacts that connect the silicide layers 209p1, 209p2, 209n1, and 209n2 to first metal lines 213b, 213b, 213d, and 213f, respectively; 211a denotes a contact that connects the gate line 206a and a first metal line 213c to each other; 211b denotes a contact that connects the gate line 206b and a first metal line 213a to each other; and 211c denotes a contact that connects the gate line 206c and a first metal line 213e to each other. 214b denotes a contact that connects the first metal line 213a and a second metal line 215 to each other; and 214c denotes a contact that connects the first metal line 213e and the second metal line 215 to each other. 212 denotes a contact that connects the silicide layer 203 connected to the planar silicon layer 202nb and the first metal line 213d to each other.

The n-type silicon pillar 204n1, the planar silicon layer 202p, the p+ diffusion layer 207p1, the gate insulating film 205, and the gate electrode 206 constitute the PMOS transistor Qp1. The n-type silicon pillar 204n2, the planar silicon layer 202p, the p+ diffusion layer 207p2, the gate insulating film 205, and the gate electrode 206 constitute the PMOS transistor Qp2. The p-type silicon pillar 204p1, the planar silicon layer 202na, the n+ diffusion layer 207n1, the gate insulating film 205, and the gate electrode 206 constitute the NMOS transistor Qn1. The p-type silicon pillar 204p2, the planar silicon layer 202nb, the n+ diffusion layer 207n2, the gate insulating film 205, and the gate electrode 206 constitute the NMOS transistor Qn2.

The gate line 206a is connected to the gate electrode 206 of the PMOS transistor Qp1. The gate line 206b is connected to the gate electrode 206 of the PMOS transistor Qp2. The gate line 206a is connected to the gate electrode 206 of the NMOS transistor Qn1. The gate line 206c is connected to the gate electrode 206 of the NMOS transistor Qn2.

The planar silicon layers 202p and 202na serve as a common drain of the PMOS transistors Qp1 and Qp2 and the NMOS transistor Qn1, and are connected to an output OUT1. The p+ diffusion layer 207p1, which serves as the source of the PMOS transistor Qp1, is connected to the first metal line 213b via the silicide layer 209p1 and the contact 210p1, and the power supply voltage Vcc is supplied to the first metal line 213b. The p+ diffusion layer 207p2, which serves as the source of the PMOS transistor Qp2, is connected to the first metal line 213b via the silicide layer 209p2 and the contact 210p2. The n+ diffusion layer 207n1, which serves as the source of the NMOS transistor Qn1, is connected to the first metal line 213d via the silicide layer 209n1 and the contact 210n1.

The planar silicon layer 202nb, which serves as the drain of the NMOS transistor Qn2, is connected to the first metal line 213d via the silicide layer 203 and the contact 212. Here, the source of the NMOS transistor Qn1 and the drain of the NMOS transistor Qn2 are connected to each other via the first metal line 213d. The n+ diffusion layer 207n2 serves as the source of the NMOS transistor Qn2 and is connected to the first metal line 213f via the silicide layer 209n2 and the contact 210n2. The reference voltage Vss is supplied to the first metal line 213f.

The input signal IN1 is supplied to the first metal line 213c, is supplied to the gate line 206a via the contact 211a, and is supplied to the gate electrodes of the PMOS transistor Qp1 and the NMOS transistor Qn1. The input signal IN2 is supplied to the first metal line 213a, is supplied to the gate line 206b via the contact 211b, and is supplied to the gate electrode 206 of the PMOS transistor Qp2. Also, the input signal IN2 is supplied to the second metal line 215 via the contact 214b, is supplied to the gate line 206c via the contact 214c, the first metal line 213e, and the contact 211c, and is supplied to the gate electrode 206 of the NMOS transistor Qn2.

According to this embodiment, four SGTs constituting a two-input NAND circuit can be arranged in a line without providing wasteful lines and contact regions, and a semiconductor device with a reduced area can be provided. Further, with use of the second metal line, the gate line 206b according to the second embodiment can be omitted. Further, the current flow directions of the NMOS transistor Qn1 and the NMOS transistor Qn2 (the orientations of the drains and sources) can be the same. Accordingly, the same current characteristic can be obtained and a favorable characteristic can be obtained.

Seventh Embodiment

Figure 8:
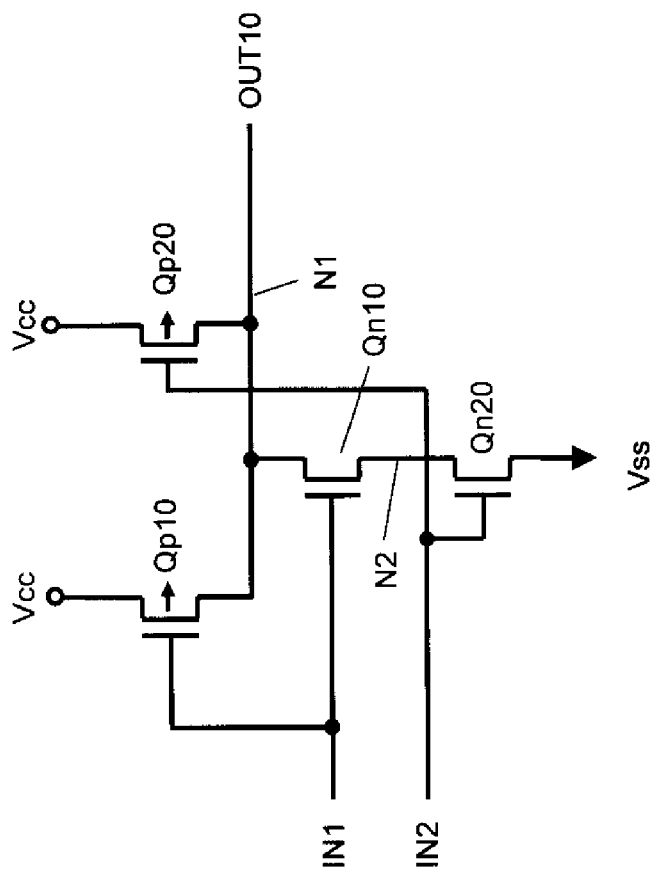
FIG. 8 is a second equivalent circuit diagram illustrating the NAND circuit according to the embodiment of the present invention.

FIG. 8 illustrates a modification example of the two-input NAND circuit illustrated in FIG. 1. In FIG. 1, a common power supply voltage Vcc is supplied to the sources of the PMOS transistors Qp1 and Qp2. In FIG. 8, power supply voltages Vcc are supplied to the sources of the PMOS transistors Qp10 and Qp20, respectively. The operation of the NAND circuit illustrated in FIG. 8 is the same as that of the NAND circuit illustrated in FIG. 1, but the wiring method for power supply lines in the case of arranging transistors is different. In a seventh embodiment, an arrangement based on FIG. 8 will be described.

Figure 9A:
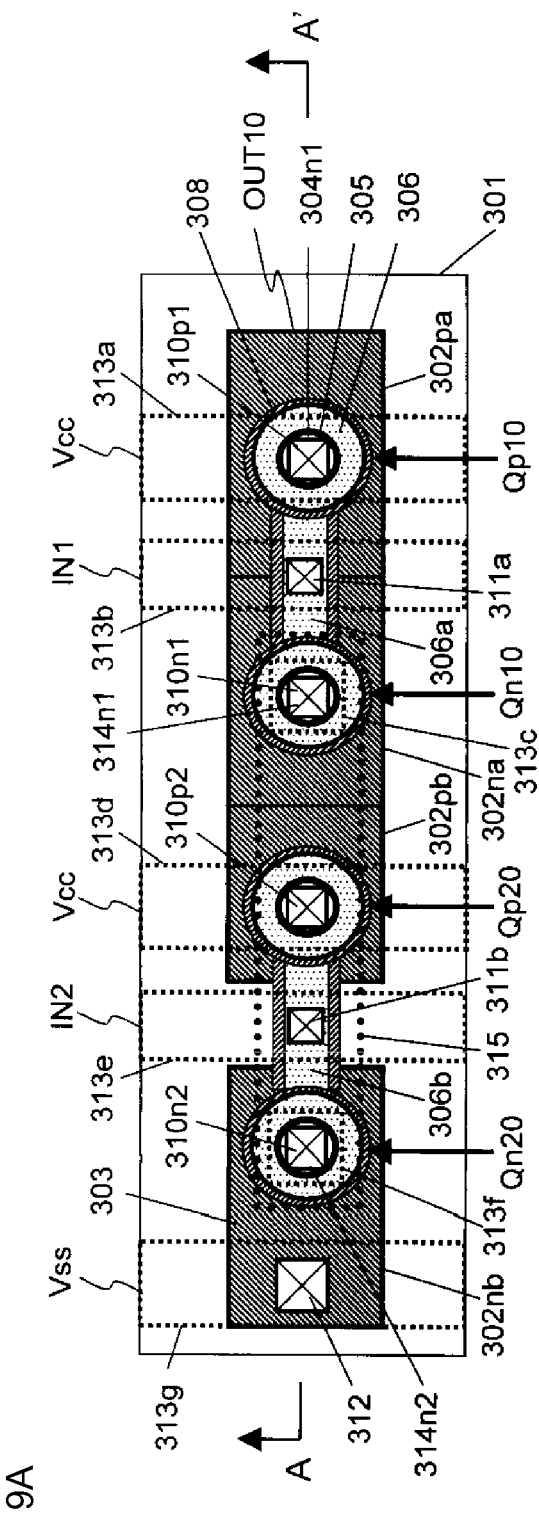
FIG. 9A is a plan view of a NAND circuit according to a seventh embodiment of the present invention.
Figure 9B:
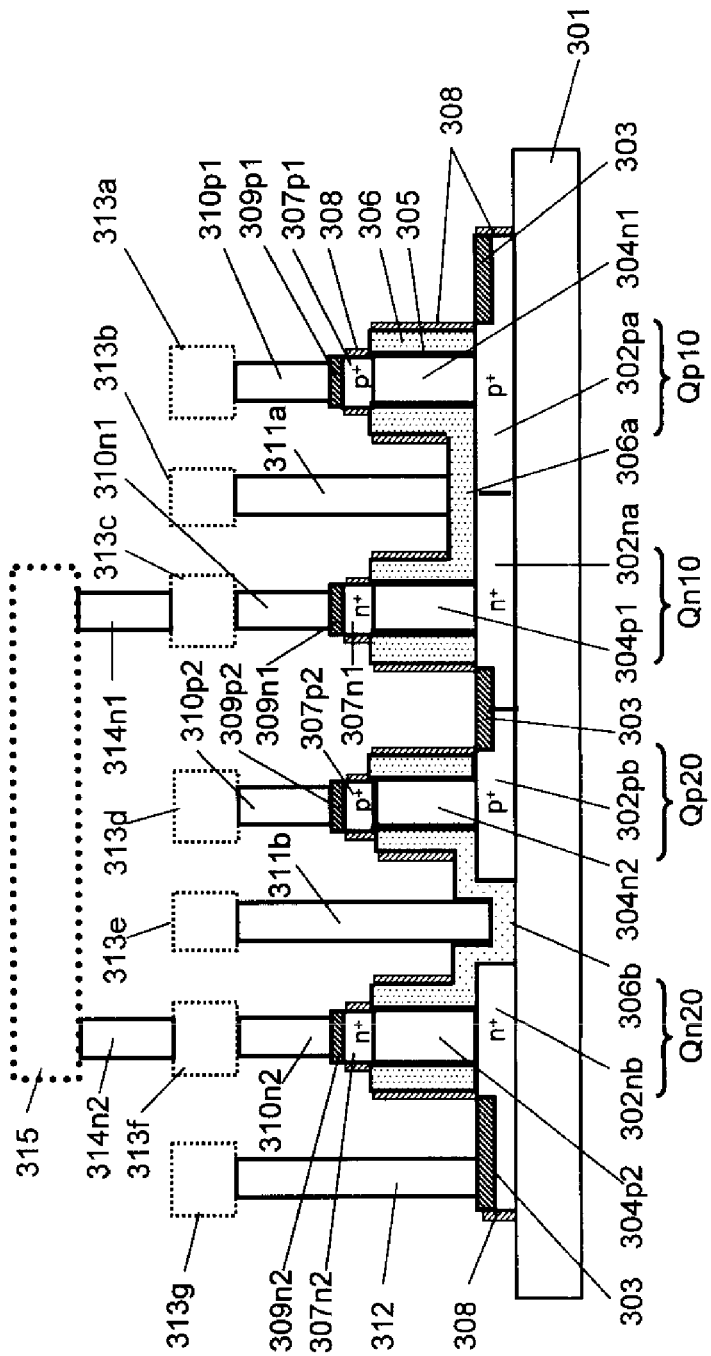
FIG. 9B is a cross-sectional view of the NAND circuit according to the seventh embodiment of the present invention.

FIGS. 9A and 9B illustrate an arrangement according to the seventh embodiment. FIG. 9A is a plan view illustrating the layout (arrangement) of a two-input NAND circuit according to the present invention, and FIG. 9B is a cross-sectional view taken along a cut line A-A'.

Referring to FIG. 9A, the PMOS transistor Qp10, the NMOS transistor Qn10, the PMOS transistor Qp20, and the NMOS transistor Qn20 of the NAND circuit illustrated in FIG. 8 are arranged in a line from the right. In FIGS. 9A and 9B, the components having the same structure as that in FIGS. 2A and 2B are denoted by equivalent reference numerals in the 300s.

Planar silicon layers 302pa, 302na, 302pb, and 302nb are disposed on an insulating film, such as a buried oxide (BOX) layer 301 disposed on a substrate. The planar silicon layers 302pa, 302na, 302pb, and 302nb are formed of a p+ diffusion layer, an n+ diffusion layer, a p+ diffusion layer, and an n+ diffusion layer, respectively, through impurity implantation or the like, and serve as lower diffusion layers. 303 denotes a silicide layer disposed on surfaces of the planar silicon layers 302pa, 302na, 302pb, and 302nb, which connects the planar silicon layers 302pa, 302na, and 302pb to one another. 304n1 and 304n2 denote n-type silicon pillars; 304p1 and 304p2 denote p-type silicon pillars; 305 denotes a gate insulating film surrounding the silicon pillars 304n1, 304n2, 304p1, and 304p2; 306 denotes a gate electrode; and 306a and 306b denote gate lines. P+ diffusion layers 307p1 and 307p2 are formed at the tops of the n-type silicon pillars 304n1 and 304n2, respectively, through impurity implantation or the like, and serve as upper diffusion layers. N+ diffusion layers 307n1 and 307n2 are formed at the tops of the p-type silicon pillars 304p1 and 304p2, respectively, through impurity implantation or the like, and serve as upper diffusion layers. 308 denotes a silicon nitride film for protecting the gate insulating film 305; 309p1, 309p2, 309n1, and 309n2 denote silicide layers connected to the p+ diffusion layers 307p1 and 307p2 and the n+ diffusion layers 307n1 and 307n2, respectively; 310p1, 310p2, 310n1, and 310n2 denote contacts that connect the silicide layers 309p1, 309p2, 309n1, and 309n2 to first metal lines 313a, 313d, 313c, and 313f, respectively; 311a denotes a contact that connects the gate line 306a and a first metal line 313b to each other; and 311 b denotes a contact that connects the gate line 306b and a first metal line 313e to each other. 312 denotes a contact that connects the silicide layer 303 connected to the planar silicon layer 302nb and a first metal line 313g to each other. 314n1 denotes a contact that connects the first metal line 313c and a second metal line 315 to each other; and 314n2 denotes a contact that connects the first metal line 313f and the second metal line 315 to each other.

The n-type silicon pillar 304n1, the planar silicon layer 302pa, the p+ diffusion layer 307p1, the gate insulating film 305, and the gate electrode 306 constitute the PMOS transistor Qp10. The n-type silicon pillar 304n2, the planar silicon layer 302pb, the p+ diffusion layer 307p2, the gate insulating film 305, and the gate electrode 306 constitute the PMOS transistor Qp20. The p-type silicon pillar 304p1, the planar silicon layer 302na, the n+ diffusion layer 307n1, the gate insulating film 305, and the gate electrode 306 constitute the NMOS transistor Qn10. The p-type silicon pillar 304p2, the planar silicon layer 302nb, the n+ diffusion layer 307n2, the gate insulating film 305, and the gate electrode 306 constitute the NMOS transistor Qn20.

The gate line 306a is connected to the gate electrode 306 of the PMOS transistor Qp10. The gate line 306b is connected to the gate electrode 306 of the PMOS transistor Qp20. The gate line 306a is connected to the gate electrode 306 of the NMOS transistor Qn10. The gate line 306b is connected to the gate electrode 306 of the NMOS transistor Qn20.

The planar silicon layers 302pa, 302na, and 302pb serve as a common drain of the PMOS transistors Qn10 and Qp20 and the NMOS transistor Qn10, and are connected to an output OUT10. The p+ diffusion layer 307p1, which serves as the source of the PMOS transistor Qp10, is connected to the first metal line 313a via the silicide layer 309p1 and the contact 310p1, and the power supply voltage Vcc is supplied to the first metal line 313a. The p+ diffusion layer 307p2, which serves as the source of the PMOS transistor Qp20, is connected to the first metal line 313d via the silicide layer 309p2 and the contact 310p2, and the power supply voltage Vcc is supplied to the first metal line 313d. The n+ diffusion layer 307n1, which serves as the source of the NMOS transistor Qn10, is connected to the first metal line 313c via the silicide layer 309n1 and the contact 310n1, and the first metal line 313c is connected to the second metal line 315 via the contact 314n1. The n+ diffusion layer 307n2, which serves as the drain of the NMOS transistor Qn20, is connected to the first metal line 313f via the silicide layer 309n2 and the contact 310n2, and the first metal line 313f is connected to the second metal line 315 via the contact 314n2. Here, the source of the NMOS transistor Qn10 and the drain of the NMOS transistor Qn20 are connected to each other via the second metal line 315. The planar silicon layer 302nb serves as the source of the NMOS transistor Qn20, and is connected to the first metal line 313g via the silicide layer 303 and the contact 312. The reference voltage Vss is supplied to the first metal line 313g.

The input signal IN1 is supplied to the first metal line 313b, is supplied to the gate line 306a via the contact 311a, and is supplied to the gate electrodes of the PMOS transistor Qp10 and the NMOS transistor Qn10. The input signal IN2 is supplied to the first metal line 313e, is supplied to the gate line 306b via the contact 311b, and is supplied to the gate electrodes of the PMOS transistor Qp20 and the NMOS transistor Qn20.

The power supply voltage Vcc supplied to the first metal line 313a and the power supply voltage Vcc supplied to the first metal line 313d are connected to each other at a position that is not illustrated, and are supplied as the same power supply voltage. FIG. 9A illustrates the power supply voltages Vcc that are supplied to the first metal line 313a and the first metal line 313d, respectively, but they are disposed in upper portions of the PMOS transistors Qp10 and QP20. Thus, an increase in the area does not occur, and the area for disposition can be reduced by utilizing the feature of the SGTs.

According to this embodiment, four SGTs constituting a two-input NAND circuit can be arranged in a line without providing wasteful lines and contact regions, and a semiconductor device with a reduced area can be provided.

Although not illustrated, the connection of the source and drain of the NMOS transistor Qn20 may be changed so that the current direction becomes the same as in the NMOS transistor Qn10, as in FIGS. 5A and 5B or FIGS. 6A and 6B.

Although not illustrated, in FIGS. 9A and 9B, the first metal line 313e, the contact 311b, and the gate line 306b for supplying a gate signal of the NMOS transistor Qn20 and the PMOS transistor Qp20 may be disposed on the left side of the NMOS transistor Qn20, that is, on the outer side of the second metal line 315. Accordingly, the first metal line 313e for supplying the input signal IN2 can be disposed without restriction of the second metal line, and therefore the degree of freedom in disposition is increased.

Eighth Embodiment

Figure 10A:
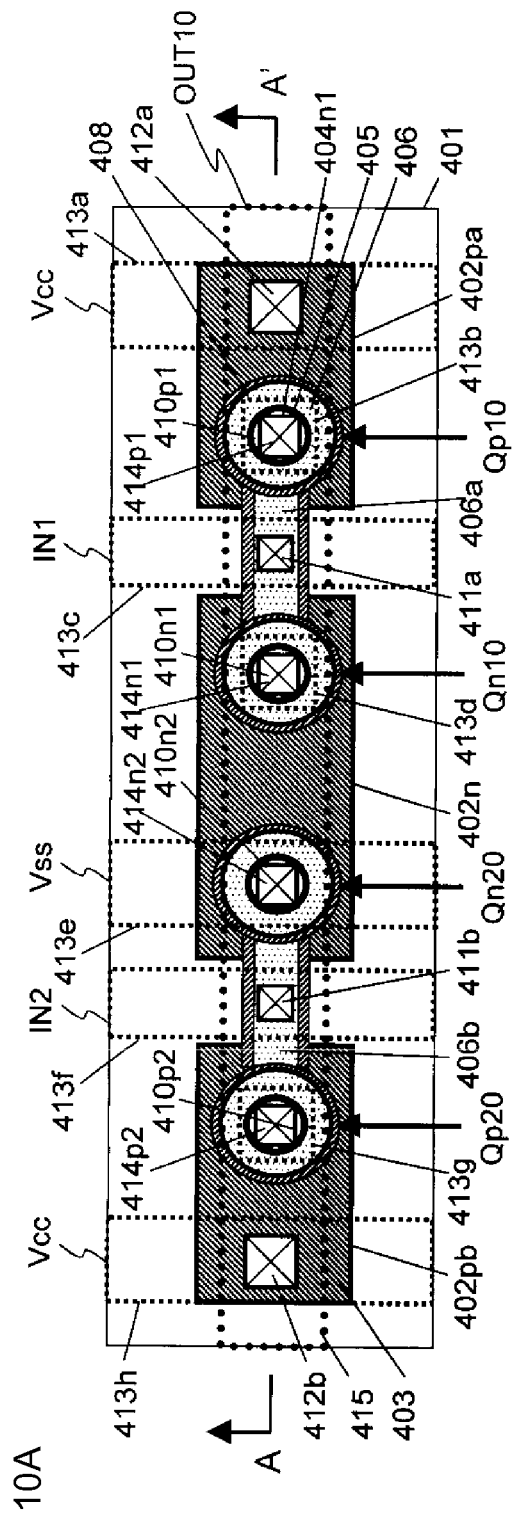
FIG. 10A is a plan view of a NAND circuit according to an eighth embodiment of the present invention.
Figure 10B:
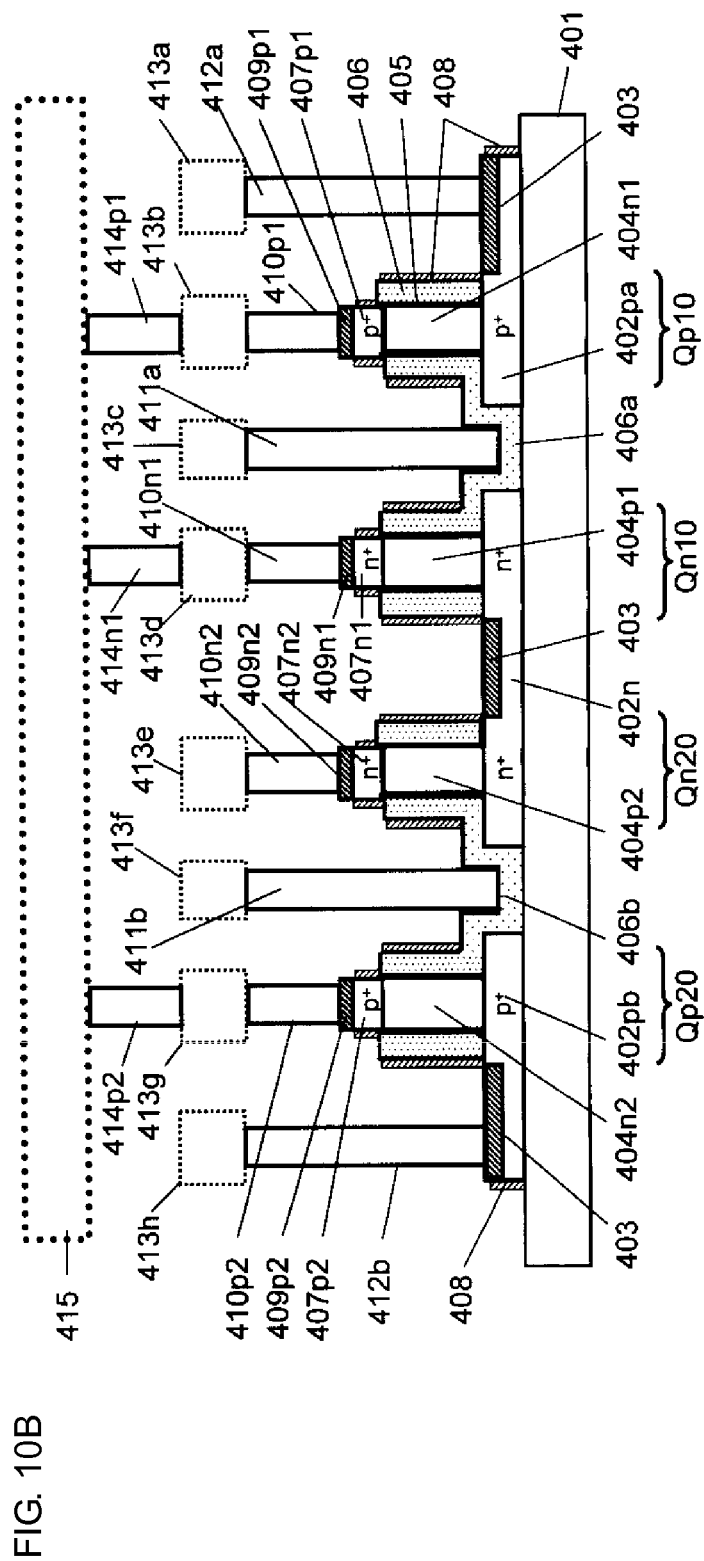
FIG. 10B is a cross-sectional view of the NAND circuit according to the eighth embodiment of the present invention.

FIGS. 10A and 10B illustrate still another embodiment. The equivalent circuit diagram of this embodiment is based on FIG. 8.

This embodiment is greatly different from the above-described first to seventh embodiments in that the orientations of the sources and drains of the PMOS transistors Qp10 and Qp20 and the NMOS transistors Qn10 and Qn20 are reversed upside down. FIG. 10A is a plan view illustrating the layout (arrangement) of a two-input NAND circuit according to the present invention, and FIG. 10B is a cross-sectional view taken along a cut line A-A'.

Referring to FIG. 10A, the PMOS transistor Qp10, the NMOS transistors Qn10 and Qn20, and the PMOS transistor Qp20 of the NAND circuit illustrated in FIG. 8 are arranged in a line from the right. In FIGS. 10A and 10B, the components having the same structure as that in FIGS. 2A and 2B are denoted by equivalent reference numerals in the 400s.

Planar silicon layers 402pa, 402n, and 402pb are disposed on an insulating film, such as a buried oxide (BOX) layer 401 disposed on a substrate. The planar silicon layers 402pa, 402n, and 402pb are formed of a p+ diffusion layer, an n+ diffusion layer, and a p+ diffusion layer, respectively, through impurity implantation or the like, and serve as lower diffusion layers. 403 denotes a silicide layer disposed on surfaces of the planar silicon layers 402pa, 402n, and 402pb. 404n1 and 404n2 denote n-type silicon pillars; 404p1 and 404p2 denote p-type silicon pillars; 405 denotes a gate insulating film surrounding the silicon pillars 404n1, 404n2, 404p1, and 404p2; 406 denotes a gate electrode; and 406a and 406b denote gate lines. P+ diffusion layers 407p1 and 407p2 are formed at the tops of the n-type silicon pillars 404n1 and 404n2, respectively, through impurity implantation or the like, and serve as upper diffusion layers. N+ diffusion layers 407n1 and 407n2 are formed at the tops of the p-type silicon pillars 404p1 and 404p2, respectively, through impurity implantation or the like, and serve as upper diffusion layers. 408 denotes a silicon nitride film for protecting the gate insulating film 405; 409p1, 409p2, 409n1, and 409n2 denote silicide layers connected to the p+ diffusion layers 407p1 and 407p2 and the n+ diffusion layers 407n1 and 407n2, respectively; 410p1, 410p2, 410n1, and 410n2 denote contacts that connect the silicide layers 409p1, 409p2, 409n1, and 409n2 to first metal lines 413b, 413g, 413d, and 413e, respectively; 411a denotes a contact that connects the gate line 406a and a first metal line 413c to each other; and 411b denotes a contact that connects the gate line 406b and a first metal line 413f to each other. 412a denotes a contact that connects the silicide layer 403 connected to the planar silicon layer 402pa and a first metal line 413a to each other; and 412b denotes a contact that connects the silicide layer 403 connected to the p+ diffusion layer 402pb and a first metal line 413h to each other. 414p1 denotes a contact that connects the first metal line 413b and a second metal line 415 to each other; 414p2 denotes a contact that connects the first metal line 413g and the second metal line 415 to each other; and 414n1 denotes a contact that connects the first metal line 413d and the second metal line 415 to each other.

The n-type silicon pillar 404n1, the planar silicon layer 402pa, the p+ diffusion layer 407p1, the gate insulating film 405, and the gate electrode 406 constitute the PMOS transistor Qp10. The n-type silicon pillar 404n2, the planar silicon layer 402pb, the p+ diffusion layer 407p2, the gate insulating film 405, and the gate electrode 406 constitute the PMOS transistor Qp20. The p-type silicon pillar 404p1, the planar silicon layer 402n, the n+ diffusion layer 407n1, the gate insulating film 405, and the gate electrode 406 constitute the NMOS transistor Qn10. The p-type silicon pillar 404p2, the planar silicon layer 402n, the n+ diffusion layer 407n2, the gate insulating film 405, and the gate electrode 406 constitute the NMOS transistor Qn20.

The gate line 406a is connected to the gate electrode 406 of the PMOS transistor Qp10. The gate line 406b is connected to the gate electrode 406 of the PMOS transistor Qp20. The gate line 406a is connected to the gate electrode 406 of the NMOS transistor Qn10. The gate line 406b is connected to the gate electrode 406 of the NMOS transistor Qn20.

The second metal line 415 serves as a common drain of the PMOS transistors Qp10 and Qp20 and the NMOS transistor Qn10, and are connected to an output OUT10. The planar silicon layer 402pa, which serves as the source of the PMOS transistor Qp10, is connected to the first metal line 413a via the silicide layer 403 and the contact 412a, and the power supply voltage Vcc is supplied to the first metal line 413a. The planar silicon layer 402pb, which serves as the source of the PMOS transistor Qp20, is connected to the first metal line 413h via the silicide layer 403 and the contact 412b, and the power supply voltage Vcc is supplied to the first metal line 413h. The planar silicon layer 402n, which serves as the source of the NMOS transistor Qn10, serves as the drain of the NMOS transistor Qn20. The n+ diffusion layer 407n2, which serves as the source of the NMOS transistor Qn20, is connected to the first metal line 413e via the silicide layer 409n2 and the contact 410n2, and the reference voltage Vss is supplied to the first metal line 413e.

The input signal IN1 is supplied to the first metal line 413c, is supplied to the gate line 406a via the contact 411a, and is supplied to the gate electrodes 406 of the PMOS transistor Qp10 and the NMOS transistor Qn10. The input signal IN2 is supplied to the first metal line 413f, is supplied to the gate line 406b via the contact 411b, and is supplied to the gate electrodes 406 of the PMOS transistor Qp20 and the NMOS transistor Qn20.

In this embodiment, power supply voltages Vcc are respectively supplied to the first metal lines 413a and 413h, but they are disposed at the right and left ends in the figure. Thus, the power supply voltages Vcc can be shared in the case of arranging the circuits according to the embodiment of the present invention side by side (not illustrated) without causing an increase in the area. Accordingly, the area for arrangement can be reduced by utilizing the feature of the SGTs.

Further, in this embodiment, the output OUT10 is connected to the second metal line, and thus there is a degree of freedom in obtaining an output. For example, the second metal line 415, which serves as an output line, can be freely extended in the right direction or left direction in FIG. 10A.

According to this embodiment, four SGTs constituting a two-input NAND circuit can be arranged in a line without providing wasteful lines and contact regions, and a semiconductor device with a reduced area can be provided.

Ninth Embodiment

Figure 11A:
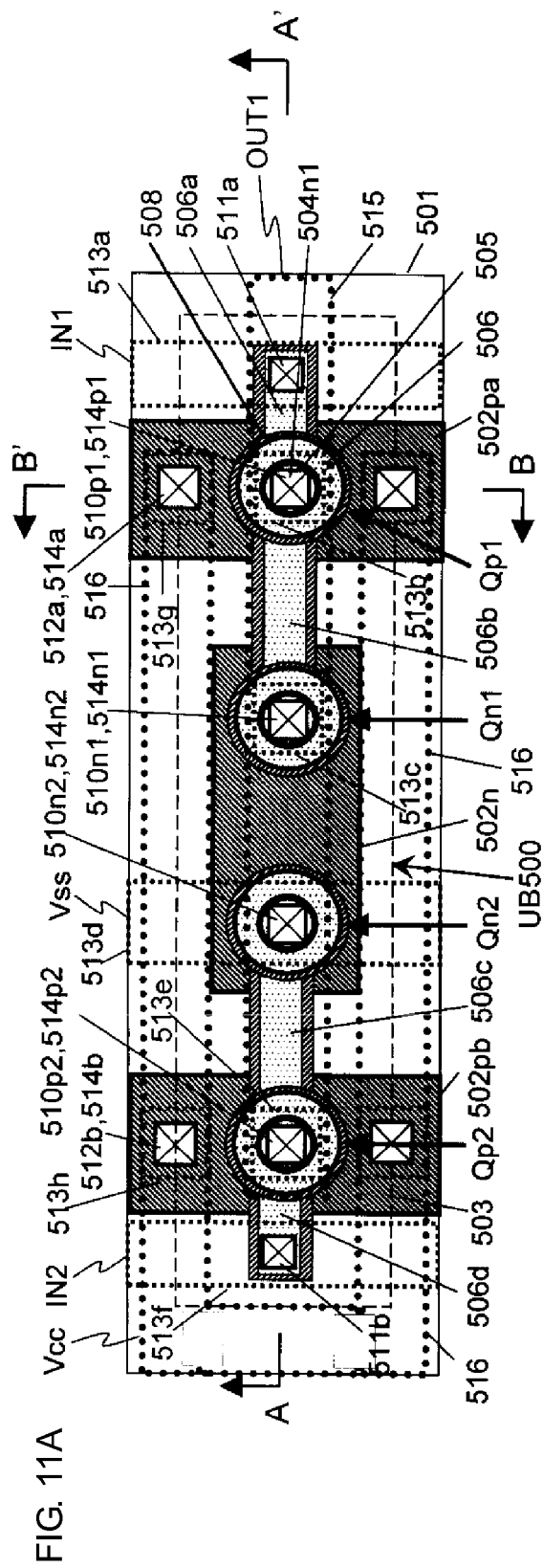
FIG. 11A is a plan view of a NAND circuit according to a ninth embodiment of the present invention.
Figure 11B:
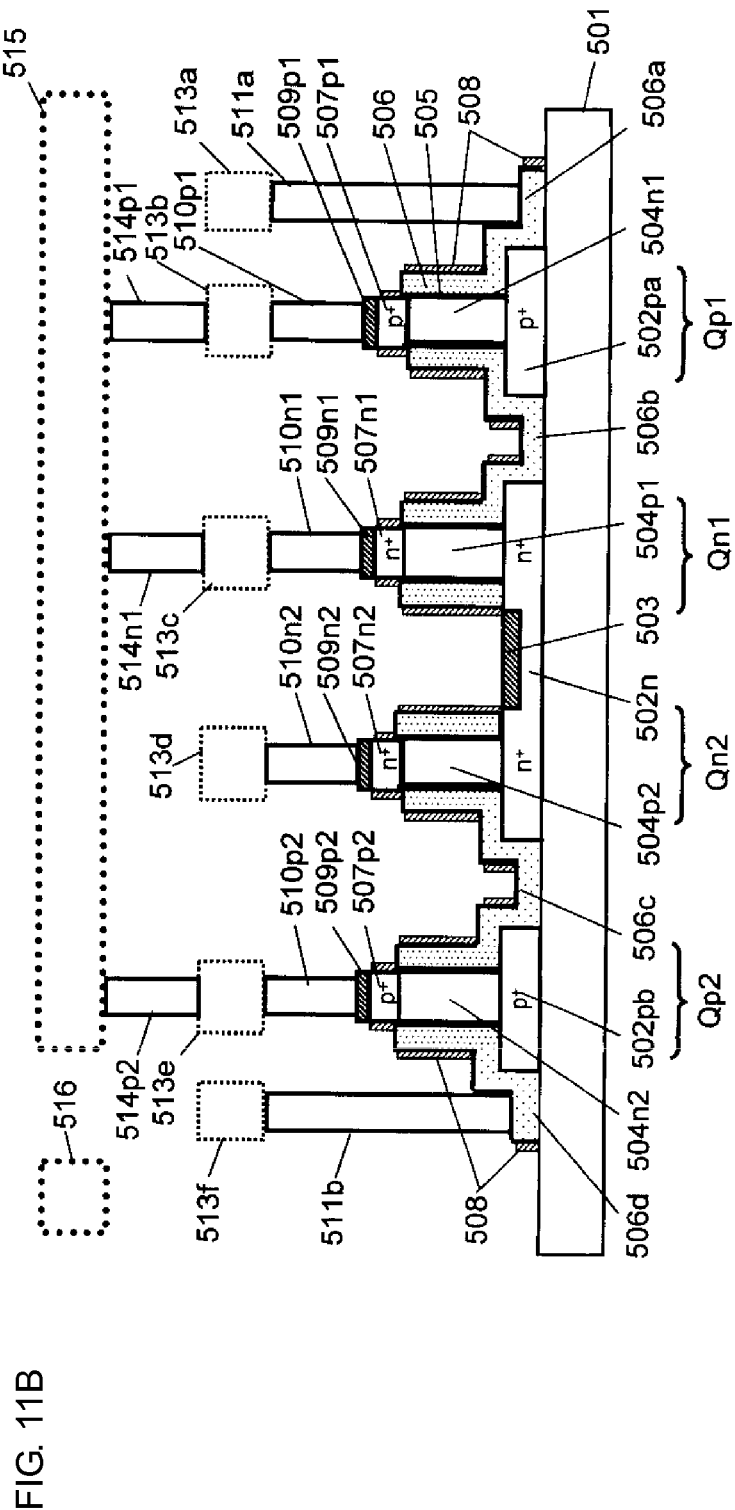
FIG. 11B is a cross-sectional view of the NAND circuit according to the ninth embodiment of the present invention.
Figure 11C:
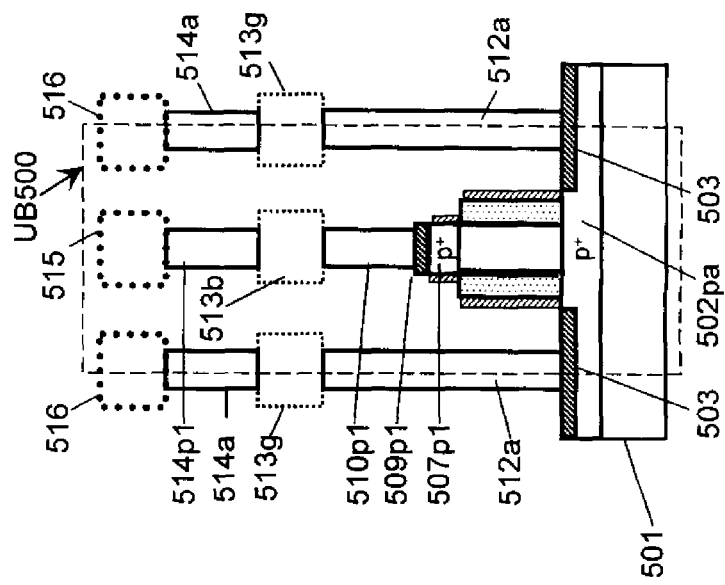
FIG. 11C is a cross-sectional view of the NAND circuit according to the ninth embodiment of the present invention.

FIGS. 11A, 11B, and 11C illustrate a ninth embodiment, which is a modification example of the eighth embodiment. FIG. 11A is a plan view illustrating the layout (arrangement) of a two-input NAND circuit according to the present invention, FIG. 11B is a cross-sectional view taken along a cut line A-A', and FIG. 11C is a cross-sectional view taken along a cut line B-B'. A common power supply voltage Vcc is supplied, on the basis of the circuit diagram illustrated in FIG. 1.

Referring to FIG. 11A, the PMOS transistor Qp1, the NMOS transistors Qn1 and Qn2, and the PMOS transistor Qp2 of the NAND circuit illustrated in FIG. 1 are arranged in a line from the right. In FIGS. 11A and 11B, the components having the same structure as that in FIGS. 10A and 10B are denoted by equivalent reference numerals in the 500s.

A difference between this embodiment and the eighth embodiment (FIGS. 10A and 10B) is that contacts 512a and 512b for supplying the power supply voltage Vcc to the PMOS transistors Qp1 and Qp2 are disposed on the upper and lower sides in FIG. 11A (right and left sides in FIG. 11C), whereas they are disposed on the right and left sides in FIGS. 10A and 10B.

Planar silicon layers 502pa, 502n, and 502pb are disposed on an insulating film, such as a buried oxide (BOX) layer 501 disposed on a substrate. The planar silicon layers 502pa, 502n, and 502pb are formed of a p+ diffusion layer, an n+ diffusion layer, and a p+ diffusion layer, respectively, through impurity implantation or the like, and serve as lower diffusion layers. 503 denotes a silicide layer disposed on surfaces of the planar silicon layers 502pa, 502n, and 502pb. 504n1 and 504n2 denote n-type silicon pillars; 504p1 and 504p2 denote p-type silicon pillars; 505 denotes a gate insulating film surrounding the silicon pillars 504n1, 504n2, 504p1, and 504p2; 506 denotes a gate electrode; and 506a, 506b, 506c, and 506d denote gate lines. P+ diffusion layers 507p1 and 507p2 are formed at the tops of the n-type silicon pillars 504n1 and 504n2, respectively, through impurity implantation or the like, and serve as upper diffusion layers. N+ diffusion layers 507n1 and 507n2 are formed at the tops of the p-type silicon pillars 504p1 and 504p2, respectively, through impurity implantation or the like, and serve as upper diffusion layers. 508 denotes a silicon nitride film for protecting the gate insulating film 505; 509p1, 509p2, 509n1, and 509n2 denote silicide layers connected to the p+ diffusion layers 507p1 and 507p2 and the n+ diffusion layers 507n1 and 507n2, respectively; 510p1, 510p2, 510n1, and 510n2 denote contacts that connect the silicide layers 509p1, 509p2, 509n1, and 509n2 to first metal lines 513b, 513e, 513c, and 513d, respectively; 511a denotes a contact that connects the gate line 506a and a first metal line 513a to each other; and 511 b denotes a contact that connects the gate line 506d and a first metal line 513f to each other. In FIGS. 11A and 11C, 512a denotes a contact that connects the silicide layer 503 connected to the planar silicon layer 502pa and a first metal line 513g to each other. In FIG. 11A, 512b denotes a contact that connects the silicide layer 503 connected to the planar silicon layer 502pb and a first metal line 513h to each other. 514p1 denotes a contact that connects the first metal line 513b and a second metal line 515 to each other; 514p2 denotes a contact that connects the first metal line 513e and the second metal line 515 to each other; and 514n1 denotes a contact that connects the first metal line 513c and the second metal line 515 to each other.

The n-type silicon pillar 504n1, the planar silicon layer 502pa, the p+ diffusion layer 507p1, the gate insulating film 505, and the gate electrode 506 constitute the PMOS transistor Qp1. The n-type silicon pillar 504n2, the planar silicon layer 502pb, the p+ diffusion layer 507p2, the gate insulating film 505, and the gate electrode 506 constitute the PMOS transistor Qp2. The p-type silicon pillar 504p1, the planar silicon layer 502n, the n+ diffusion layer 507n1, the gate insulating film 505, and the gate electrode 506 constitute the NMOS transistor Qn1. The p-type silicon pillar 504p2, the planar silicon layer 502n, the n+ diffusion layer 507n2, the gate insulating film 505, and the gate electrode 506 constitute the NMOS transistor Qn2.

The gate line 506a is connected to the gate electrode 506 of the PMOS transistor Qp1. The gate line 506d is connected to the gate electrode 506 of the PMOS transistor Qp2. The gate line 506a is connected to the gate electrode 506 of the NMOS transistor Qn1 via the gate line 506b. The gate line 506d is connected to the gate electrode 506 of the NMOS transistor Qn2 via the gate line 506c.

The second metal line 515 serves as a common drain of the PMOS transistors Qp1 and Qp2 and the NMOS transistor Qn1 and is connected to an output OUT1. The planar silicon layer 502pa, which serves as the source of the PMOS transistor Qp1, is connected to the first metal line 513g via the silicide layer 503 and the contact 512a, and is further connected to a second metal line 516 via a contact 514a. The power supply voltage Vcc is supplied to the second metal line 516. The planar silicon layer 502pb, which serves as the source of the PMOS transistor Qp2, is connected to the first metal line 513h via the silicide layer 503 and the contact 512b, and is further connected to the second metal line 516 via a contact 514b. The planar silicon layer 502n, which serves as the source of the NMOS transistor Qn1, serves as the drain of the NMOS transistor Qn2. The n+ diffusion layer 507n2, which serves as the source of the NMOS transistor Qn2, is connected to the first metal line 513d via the silicide layer 509n2 and the contact 510n2, and the reference voltage Vss is supplied to the first metal line 513d.

The input signal IN1 is supplied to the first metal line 513a, is supplied to the gate line 506a via the contact 511a, and is supplied to the gate electrodes 506 of the PMOS transistor Qp1 and the NMOS transistor Qn1. The input signal IN2 is supplied to the first metal line 513f, is supplied to the gate line 506b via the contact 511b, and is supplied to the gate electrodes 506 of the PMOS transistor Qp2 and the NMOS transistor Qn2.

A basic unit of the layout of this circuit is referred to as a unit block (UB). A UB 500 is represented by a chained line. In a case where a plurality of NAND circuits are arranged in the vertical direction in units of the unit blocks, the contacts 512a and 512b for supplying the power supply voltage Vcc can be shared, and an increase in the area can be suppressed.

In this embodiment, in contrast to the eighth embodiment, the contacts 512a and 512b for supplying the power supply voltage Vcc to the PMOS transistors Qp1 and Qp2 are disposed on the upper and lower sides in the figure. Accordingly, the width in the horizontal direction can be greatly reduced. According to this embodiment, four SGTs constituting a two-input NAND circuit can be arranged in a line without providing wasteful lines and contact regions, and a semiconductor device with a reduced area can be provided.

Tenth Embodiment

Figure 12A:
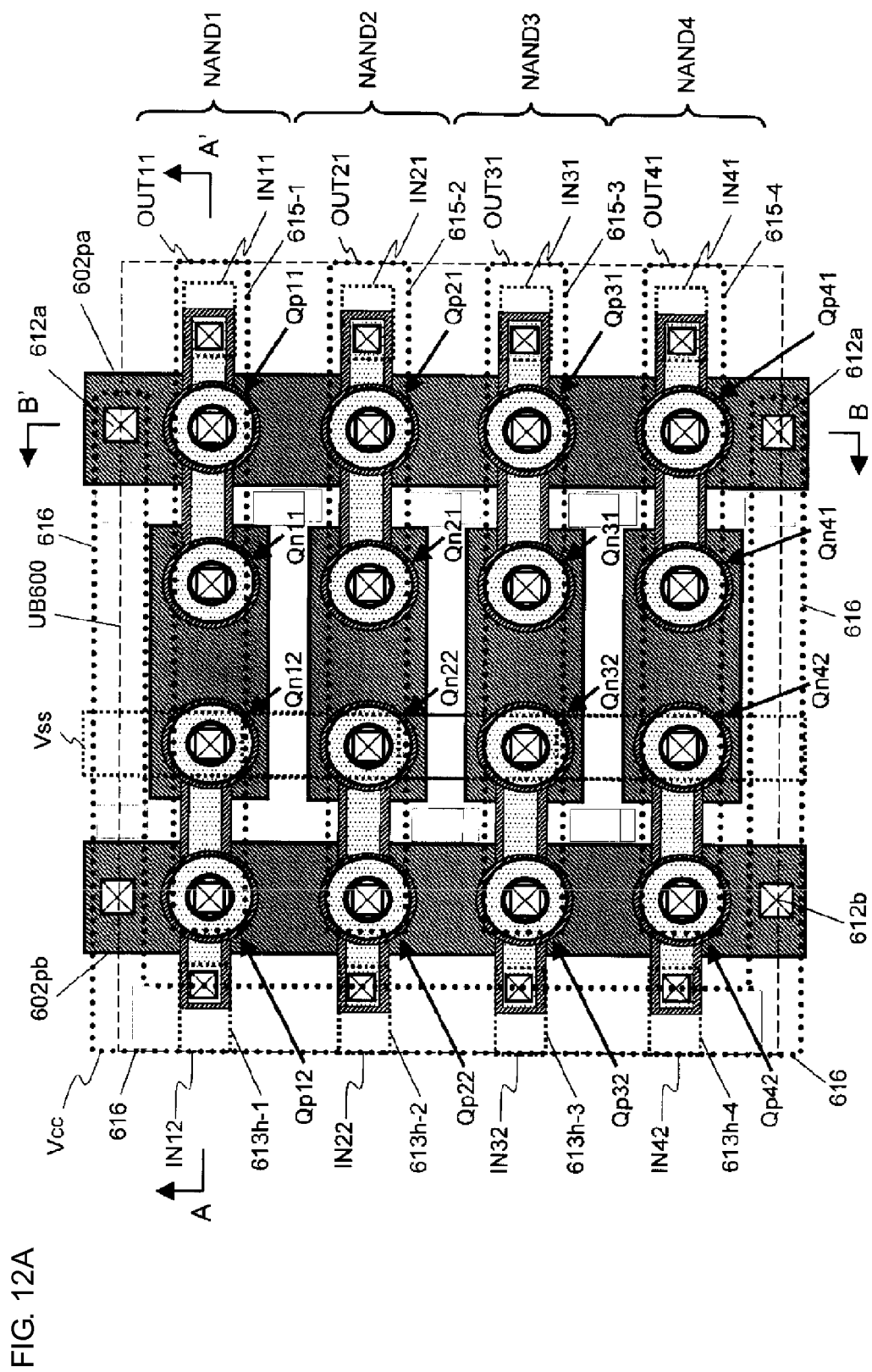
FIG. 12A is a plan view of a NAND circuit according to a tenth embodiment of the present invention.
Figure 12B:
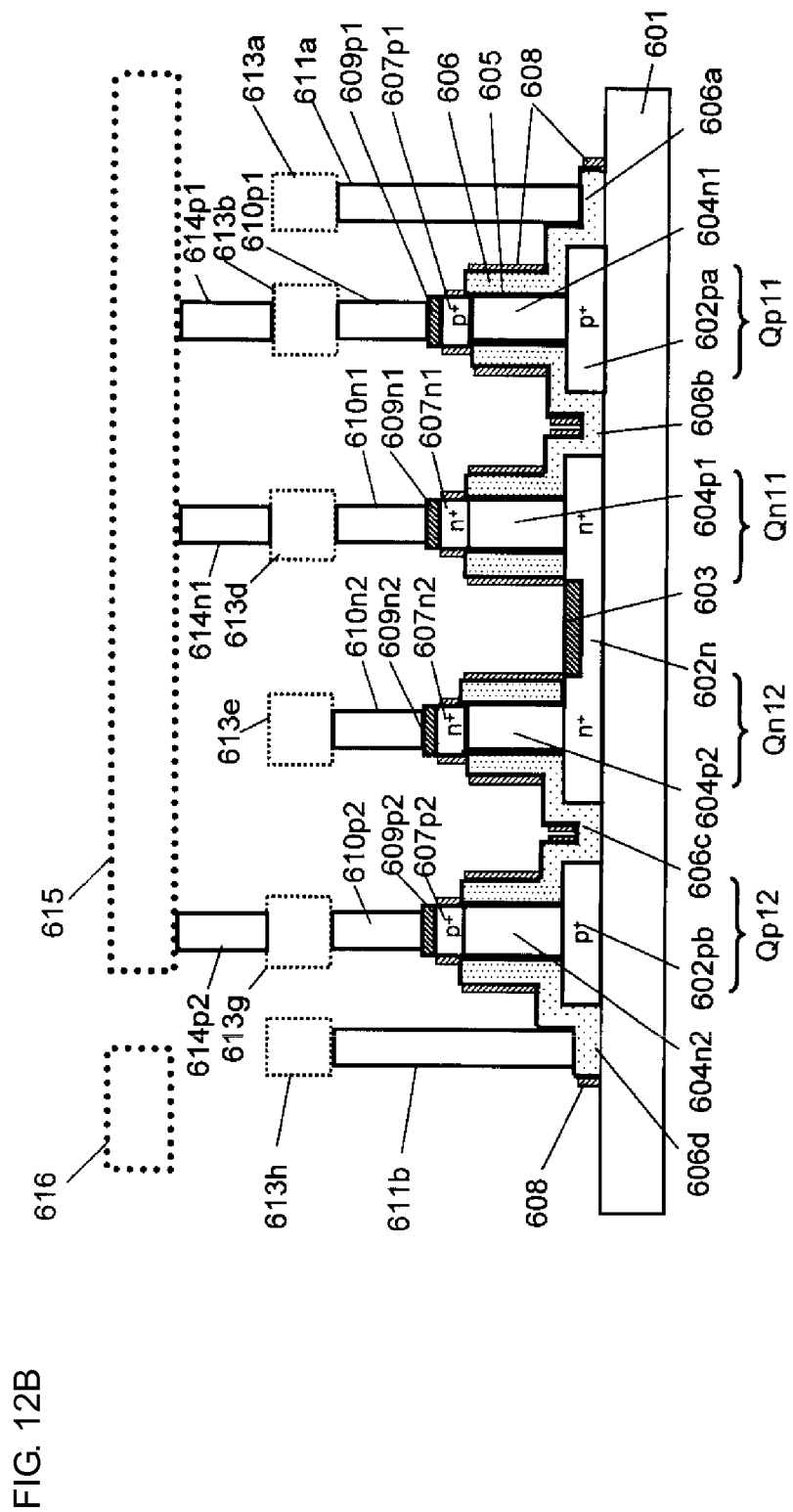
FIG. 12B is a cross-sectional view of the NAND circuit according to the tenth embodiment of the present invention.
Figure 12C:
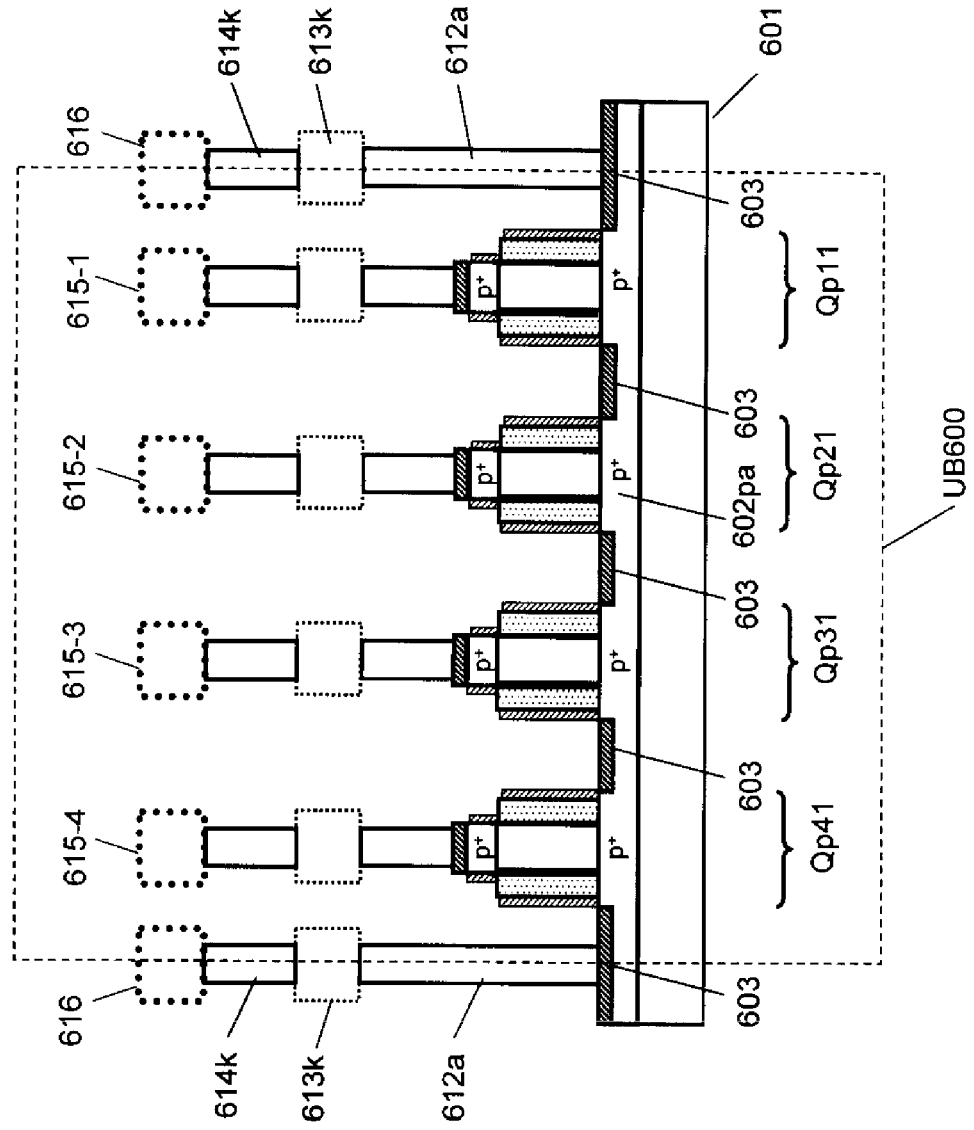
FIG. 12C is a cross-sectional view of the NAND circuit according to the tenth embodiment of the present invention.

FIGS. 12A, 12B, and 12C illustrate a tenth embodiment, which is a modification example of the ninth embodiment. FIG. 12A is a plan view illustrating the layout (arrangement) of a two-input NAND circuit according to the present invention, FIG. 12B is a cross-sectional view taken along a cut line A-A', and FIG. 12C is a cross-sectional view taken along a cut line B-B'.

FIG. 12A illustrates an example in which four NAND circuits, each being the NAND circuit illustrated in FIG. 1, are arranged. From the upper right of FIG. 12A, a PMOS transistor Qp11, NMOS transistors Qn11 and Qn12, and a PMOS transistor Qp12 are arranged in a line. Also, a PMOS transistor Qp21, NMOS transistors Qn21 and Qn22, and a PMOS transistor Qp22 are arranged in a line in the second row. Further, a PMOS transistor Qp31, NMOS transistors Qn31 and Qn32, and a PMOS transistor Qp32 are arranged in a line in the third row. Further, a PMOS transistor Qp41, NMOS transistors Qn41 and Qn42, and a PMOS transistor Qp42 are arranged in a line in the fourth row. These four sets of NAND circuits integrally constitute a NAND circuit unit block UB600.

In FIGS. 12A, 12B, and 12C, the components having the same structure as that in FIGS. 11A, 11B, and 11C are denoted by equivalent reference numerals in the 600s, and the description thereof is omitted. Hereinafter, a difference from the ninth embodiment will be described.

In this embodiment, the four sets of NAND circuits are provided with a pair of contacts 612a and 612b. The contact 612a supplies the power supply voltage Vcc to the PMOS transistors Qp11, Qp21, Qp31, and QP41. The contact 612b supplies the power supply voltage Vcc to the PMOS transistors Qp12, Qp22, Qp32, and Qp42. Further, as a metal line for supplying the power supply voltage Vcc, a second metal line 616 is provided so as to extend in the horizontal direction in FIG. 12A. In FIG. 12C, the sources of the PMOS transistors Qp11, QP21, Qp31, and Qp41 are connected to a planar silicon layer 602pa, and are connected to a first metal line 613k via a silicide layer 603 connected to the planar silicon layer 602pa and the contact 612a. The first metal line 613k is connected to the second metal line 616 via a contact 614k. As illustrated in FIG. 12A, the second metal line 616 extends in the horizontal direction on the upper side, the horizontal direction on the lower side, and the vertical direction on the left side, so that the power supply voltage Vcc can be freely supplied from the right and left. Further, with the power supply voltage Vcc being supplied in units of blocks, the NAND circuits can be arranged with a minimum interval in the vertical direction in FIG. 12A, relative to the embodiment illustrated in FIGS. 11A to 11C, and thus the entire size can be reduced.

In this embodiment, a pair of contacts are provided for four sets of NAND circuits. However, in a power supply path, current flows via the silicide layer 603, and thus the resistance of a silicide line may cause voltage drop. Thus, the number of sets may be determined in consideration of the amount of current consumption and a resistance value. According to this embodiment, four SGTs constituting a two-input NAND circuit can be arranged in a line without providing wasteful lines and contact regions, and a semiconductor device with a reduced area can be provided.

Eleventh Embodiment

Figure 13A:
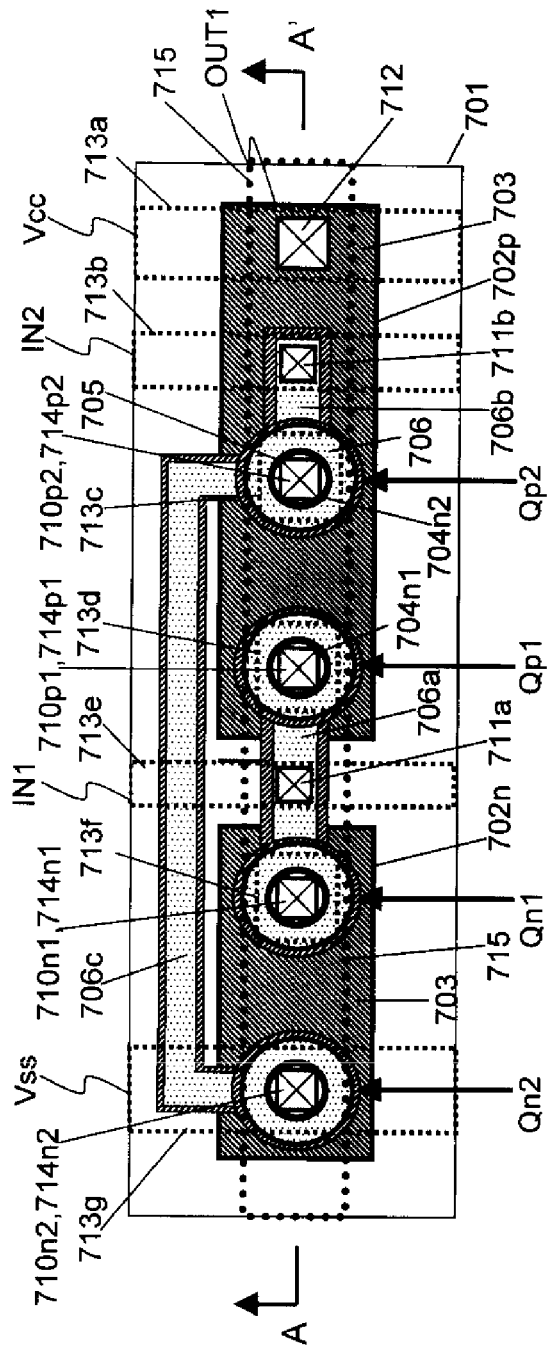
FIG. 13A is a plan view of a NAND circuit according to an eleventh embodiment of the present invention.
Figure 13B:
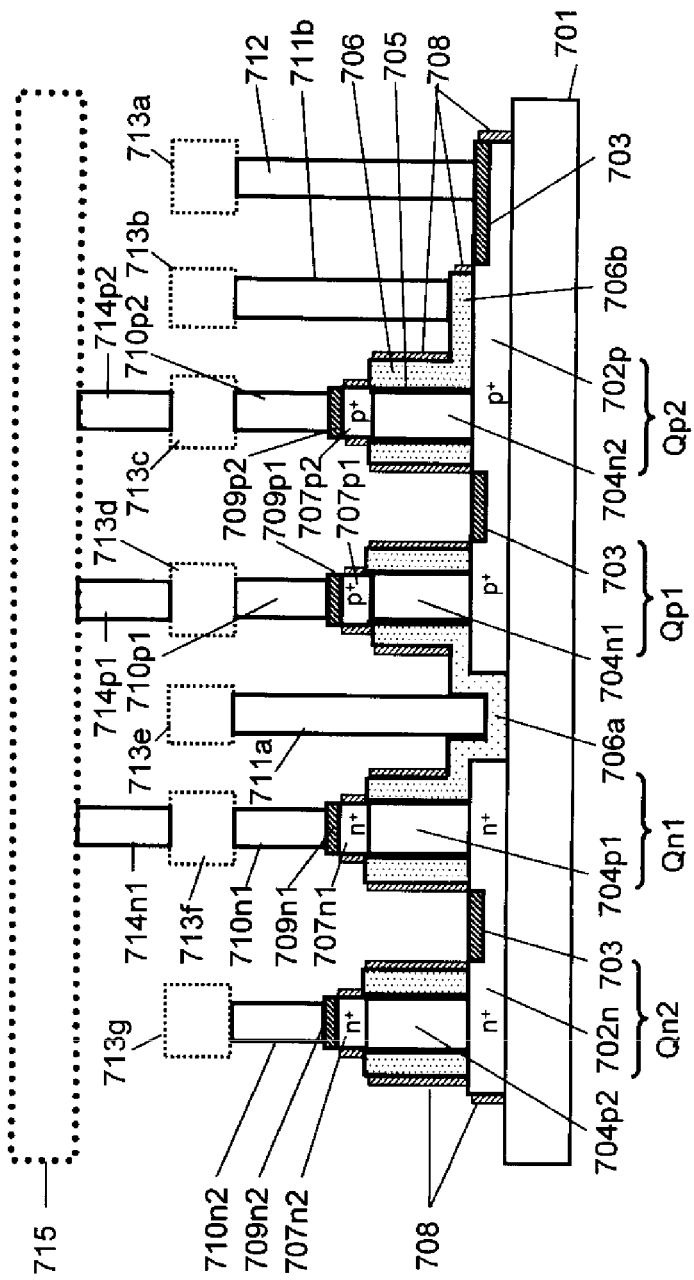
FIG. 13B is a cross-sectional view of the NAND circuit according to the eleventh embodiment of the present invention.

FIGS. 13A and 13B illustrate the arrangement according to an eleventh embodiment. FIG. 13A is a plan view illustrating the layout (arrangement) of a two-input NAND circuit according to the present invention, and FIG. 13B is a cross-sectional view taken along a cut line A-A'.

Referring to FIG. 13A, the PMOS transistors Qp2 and Qp1 and the NMOS transistors Qn1 and Qn2 of the NAND circuit illustrated in FIG. 1 are arranged in a line from the right. In FIGS. 13A and 13B, the components having the same structure as that in FIGS. 2A and 2B are denoted by equivalent reference numerals in the 700s.

Planar silicon layers 702$p$ and 702$n$ are disposed on an insulating film, such as a buried oxide (BOX) layer 701 disposed on a substrate. The planar silicon layers 702$p$ and 702$n$ are formed of a p+ diffusion layer and an n+ diffusion layer, respectively, through impurity implantation or the like, and serve as lower diffusion layers. 703 denotes a silicide layer disposed on surfaces of the planar silicon layers 702$p$ and 702$n$. 704$n$1 and 704$n$2 denote n-type silicon pillars; 704$p$1 and 704$p$2 denote p-type silicon pillars; 705 denotes a gate insulating film surrounding the silicon pillars 704$n$1, 704$n$2, 704$p$1, and 704$p$2; 706 denotes a gate electrode; and 706$a$, 706$b$, and 706$c$ denote gate lines. P+ diffusion layers 707$p$1 and 707$p$2 are formed at the tops of the n-type silicon pillars 704$n$1 and 704$n$2, respectively, through impurity implantation or the like, and serve as upper diffusion layers. N+ diffusion layers 707$n$1 and 707$n$2 are formed at the tops of the p-type silicon pillars 704$p$1 and 704$p$2, respectively, through impurity implantation or the like, and serve as upper diffusion layers. 708 denotes a silicon nitride film for protecting the gate insulating film 705; 709$p$1, 709$p$2, 709$n$1, and 709$n$2 denote silicide layers connected to the p+ diffusion layers 707$p$1 and 707$p$2 and the n+ diffusion layers 707$n$1 and 707$n$2, respectively; 710$p$1, 710$p$2, 710$n$1, and 710$n$2 denote contacts that connect the silicide layers 709$p$1, 709$p$2, 709$n$1, and 709$n$2 to first metal lines 713$d$, 713$c$, 713$f$, and 713$g$, respectively; 711$a$ denotes a contact that connects the gate line 706$a$ and a first metal line 713$e$ to each other; and 711$b$ denotes a contact that connects the gate line 706$b$ and a first metal line 713$b$ to each other. 712 denotes a contact that connects the silicide layer 703 connected to the planar silicon layer 702$p$ and a first metal line 713$a$ to each other. 714$p$1 denotes a contact that connects the first metal line 713$d$ and a second metal line 715 to each other; 714$p$2 denotes a contact that connects the first metal line 713$c$ and the second metal line 715 to each other; and 714$n$1 denotes a contact that connects the first metal line 713$f$ and the second metal line 715 to each other.

The n-type silicon pillar 704$n$1, the planar silicon layer 702$p$, the p+ diffusion layer 707$p$1, the gate insulating film 705, and the gate electrode 706 constitute the PMOS transistor Qp1. The n-type silicon pillar 704$n$2, the planar silicon layer 702$p$, the p+ diffusion layer 707$p$2, the gate insulating film 705, and the gate electrode 706 constitute the PMOS transistor Qp2. The p-type silicon pillar 704$p$1, the planar silicon layer 702$n$, the n+ diffusion layer 707$n$1, the gate insulating film 705, and the gate electrode 706 constitute the NMOS transistor Qn1. The p-type silicon pillar 704$p$2, the planar silicon layer 702$n$, the n+ diffusion layer 707$n$2, the gate insulating film 705, and the gate electrode 706 constitute the NMOS transistor Qn2.

The gate line 706$a$ is connected to the gate electrode 706 of the PMOS transistor Qp1. The gate line 706$b$ is connected to the gate electrode 706 of the PMOS transistor Qp2. The gate line 706$a$ is connected to the gate electrode 706 of the NMOS transistor Qn1. The gate line 706$b$ is connected to the gate electrode 706 of the NMOS transistor Qn2 via the gate line 706$c$.

The second metal line 715 serves as a common drain of the PMOS transistors Qp1 and Qp2 and the NMOS transistor Qn1 and is connected to an output OUT1. The planar silicon layer 702$p$, which serves as the sources of the PMOS transistors Qp1 and Qp2, is connected to the first metal line 713$a$ via the silicide layer 703 and the contact 712, and the power supply voltage Vcc is supplied to the first metal line 713$a$. The planar silicon layer 702$n$, which serves as the source of the NMOS transistor Qn1, serves as the drain of the NMOS transistor Qn2. The n+ diffusion layer 707$n$2, which serves as the source of the NMOS transistor Qn2, is connected to the first metal line 713$g$ via the silicide layer 709$n$2 and the contact 710$n$2, and the reference voltage Vss is supplied to the first metal line 713$g$.

The input signal IN1 is supplied to the first metal line 713$e$, is supplied to the gate line 706$a$ via the contact 711$a$, and is supplied to the gate electrodes 706 of the PMOS transistor Qp1 and the NMOS transistor Qn1. The input signal IN2 is supplied to the first metal line 713$d$, is supplied to the gate line 706$b$ via the contact 711$b$, and is supplied to the gate electrode 706 of the PMOS transistor Qp2. Also, the input signal IN2 is supplied to the gate electrode 706 of the NMOS transistor Qn2 via the gate line 706$c$.

In this embodiment, the power supply voltage Vcc can be supplied from the rightmost side in the figure, and the reference voltage Vss can be supplied from the leftmost side in the figure. Thus, in a case where a plurality of circuits (not illustrated) are arranged side by side, the power supply voltage Vcc and the reference voltage Vss can be shared by the circuits, and the area can be further reduced.

According to this embodiment, four SGTs constituting a two-input NAND circuit can be arranged in a line without providing wasteful lines and contact regions, and a semiconductor device with a reduced area can be provided.

Twelfth Embodiment

Figure 14:
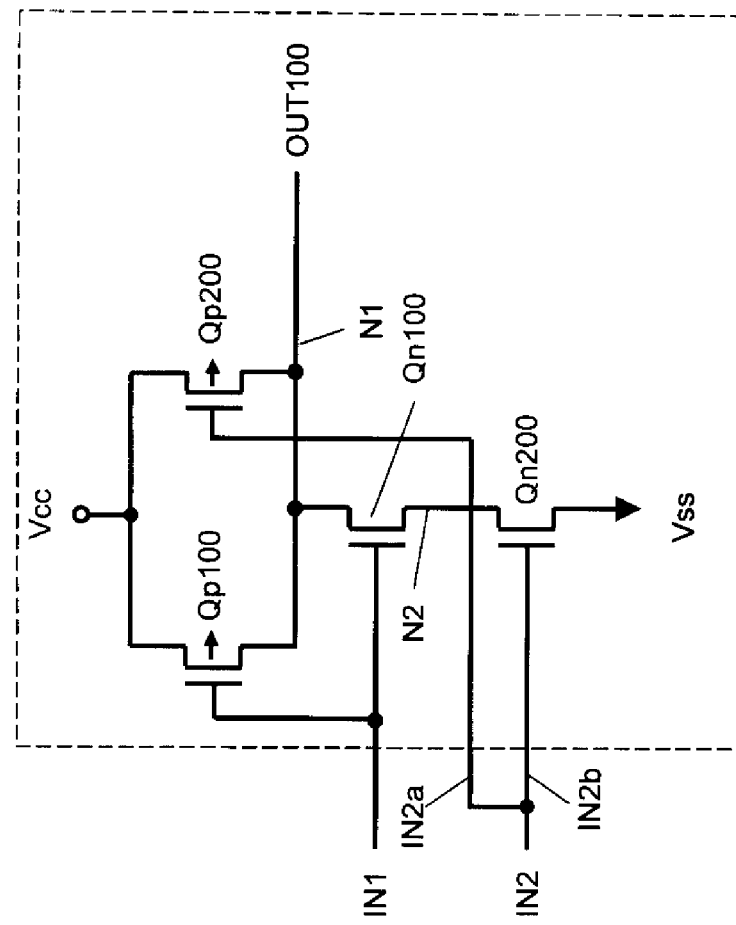
FIG. 14 is a third equivalent circuit diagram illustrating the NAND circuit according to the embodiment of the present invention.

FIG. 14 illustrates another NAND circuit. A difference from the NAND circuit illustrated in FIG. 1 is that an input signal for a PMOS transistor Qp200 and an input signal for an NMOS transistor Qn200 are supplied through different lines. An input signal IN2$a$ is input to the gate of the PMOS transistor Qp200, and an input signal IN2$b$ is input to the gate of the NMOS transistor Qn200. As illustrated in FIG. 14, the input signals IN2$a$ and IN2$b$ are connected to a common input signal IN2 at another position, and thus the operation is the same as in FIG. 1. Here, the lines for the input signals IN2a and IN2b are individually provided for the convenience of arrangement.

Figure 15A:
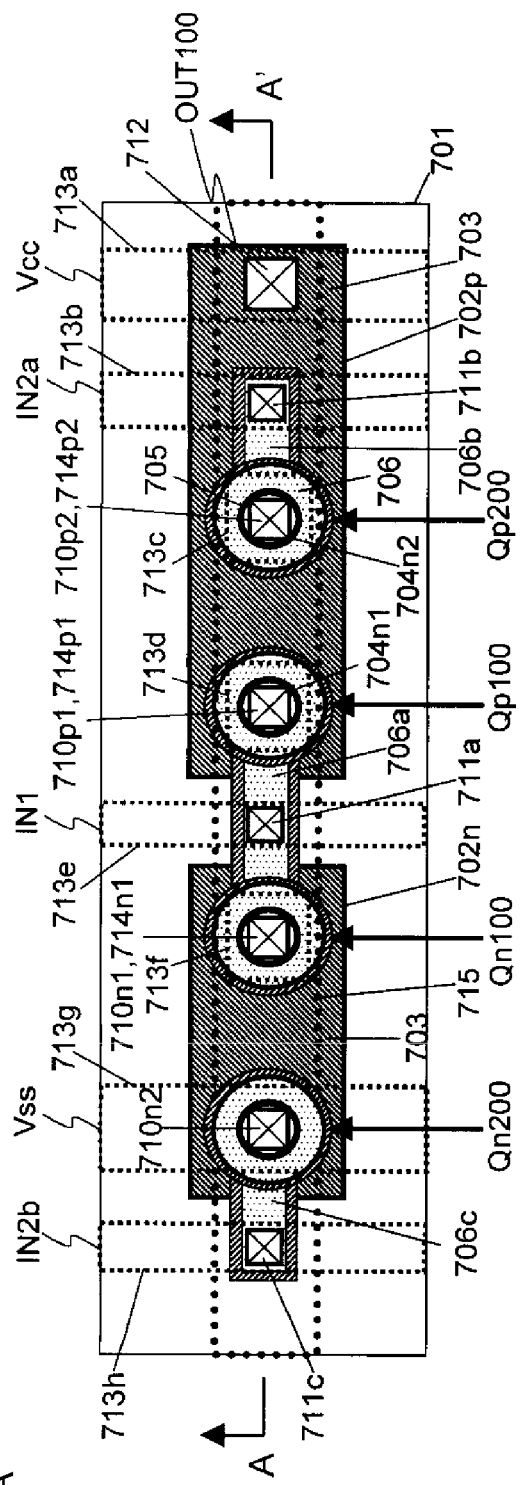
FIG. 15A is a plan view of a NAND circuit according to a twelfth embodiment of the present invention.
Figure 15B:
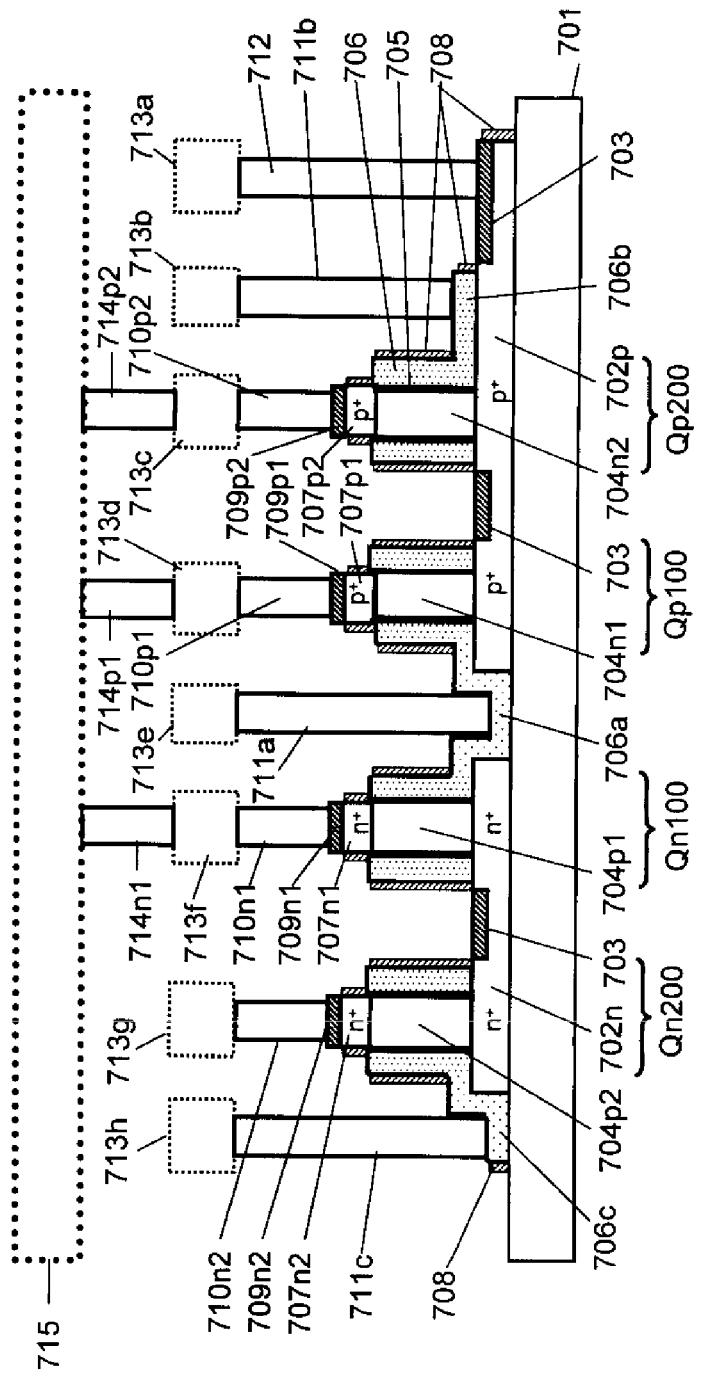
FIG. 15B is a cross-sectional view of the NAND circuit according to the twelfth embodiment of the present invention.

An embodiment based on the connections illustrated in FIG. 14 is illustrated in FIGS. 15A and 15B. FIGS. 15A and 15B illustrate a modification example of the embodiment illustrated in FIGS. 13A and 13B.

FIGS. 15A and 15B illustrate the arrangement according to a twelfth embodiment. FIG. 15A is a plan view illustrating the layout (arrangement) of a two-input NAND circuit according to the present invention, and FIG. 15B is a cross-sectional view taken along a cut line A-A'.

Referring to FIG. 15A, the PMOS transistors Qp200 and Qp100 and the NMOS transistors Qn100 and Qn200 of the NAND circuit illustrated in FIG. 14 are arranged in a line from the right. In FIGS. 15A and 15B, the components having the same structure as that in FIGS. 13A and 13B are denoted by equivalent reference numerals in the 700s.

Planar silicon layers 702p and 702n are disposed on an insulating film, such as a buried oxide (BOX) layer 701 disposed on a substrate. The planar silicon layers 702p and 702n are formed of a p+ diffusion layer and an n+ diffusion layer, respectively, through impurity implantation or the like, and serve as lower diffusion layers. 703 denotes a silicide layer disposed on surfaces of the planar silicon layers 702p and 702n. 704n1 and 704n2 denote n-type silicon pillars; 704p1 and 704p2 denote p-type silicon pillars; 705 denotes a gate insulating film surrounding the silicon pillars 704n1, 704n2, 704p1, and 704p2; 706 denotes a gate electrode; and 706a, 706b, and 706c denote gate lines. P+ diffusion layers 707p1 and 707p2 are formed at the tops of the n-type silicon pillars 704n1 and 704n2, respectively, through impurity implantation or the like, and serve as upper diffusion layers. N+ diffusion layers 707n1 and 707n2 are formed at the tops of the p-type silicon pillars 704p1 and 704p2, respectively, through impurity implantation or the like, and serve as upper diffusion layers. 708 denotes a silicon nitride film for protecting the gate insulating film 705; 709p1, 709p2, 709n1, and 709n2 denote silicide layers connected to the p+ diffusion layers 707p1 and 707p2 and the n+ diffusion layers 707n1 and 707n2, respectively; 710p1, 710p2, 710n1, and 710n2 denote contacts that connect the silicide layers 709p1, 709p2, 709n1, and 709n2 to first metal lines 713d, 713c, 713f, and 713g, respectively; 711a denotes a contact that connects the gate line 706a and a first metal line 713e to each other; 711b denotes a contact that connects the gate line 706b and a first metal line 713b to each other; and 711c denotes a contact that connects the gate line 706c and a first metal line 713h to each other. 712 denotes a contact that connects the silicide layer 703 connected to the planar silicon layer 702p and a first metal line 713a to each other. 714p1 denotes a contact that connects the first metal line 713d and a second metal line 715 to each other; 714p2 denotes a contact that connects the first metal line 713c and the second metal line 715 to each other; and 714n1 denotes a contact that connects the first metal line 713f and the second metal line 715 to each other.

The n-type silicon pillar 704n1, the planar silicon layer 702p, the p+ diffusion layer 707p1, the gate insulating film 705, and the gate electrode 706 constitute the PMOS transistor Qp100. The n-type silicon pillar 704n2, the planar silicon layer 702p, the p+ diffusion layer 707p2, the gate insulating film 705, and the gate electrode 706 constitute the PMOS transistor Qp200. The p-type silicon pillar 704p1, the planar silicon layer 702n, the n+ diffusion layer 707n1, the gate insulating film 705, and the gate electrode 706 constitute the NMOS transistor Qn100. The p-type silicon pillar 704p2, the planar silicon layer 702n, the n+ diffusion layer 707n2, the gate insulating film 705, and the gate electrode 706 constitute the NMOS transistor Qn200.

The gate line 706a is connected to the gate electrode 706 of the PMOS transistor Qp100. The gate line 706b is connected to the gate electrode 706 of the PMOS transistor Qp200. The gate line 706a is connected to the gate electrode 706 of the NMOS transistor Qn100. The gate line 706c is connected to the gate electrode 706 of the NMOS transistor Qn200.

The second metal line 715 serves as a common drain of the PMOS transistors Qp100 and Qp200 and the NMOS transistor Qn100 and is connected to an output OUT100. The planar silicon layer 702p, which serves as the sources of the PMOS transistors Qp100 and Qp200, is connected to the first metal line 713a via the silicide layer 703 and the contact 712, and the power supply voltage Vcc is supplied to the first metal line 713a. The planar silicon layer 702n, which serves as the source of the NMOS transistor Qn100, serves as the drain of the NMOS transistor Qn200. The n+ diffusion layer 707n2, which serves as the source of the NMOS transistor Qn200, is connected to the first metal line 713g via the silicide layer 709n2 and the contact 710n2, and the reference voltage Vss is supplied to the first metal line 713g.

The input signal IN1 is supplied to the first metal line 713e, is supplied to the gate line 706a via the contact 711a, and is supplied to the gate electrodes 706 of the PMOS transistor Qp100 and the NMOS transistor Qn100. The input signal IN2a is supplied to the first metal line 713b, is supplied to the gate line 706b via the contact 711b, and is supplied to the gate electrode 706 of the PMOS transistor Qp200. The input signal IN2b is supplied to the first metal line 713h, is supplied to the gate line 706c via the contact 711c, and is supplied to the gate electrode 706 of the NMOS transistor Qn200.

Note that the input signals IN2a and IN2b are equivalent to the input signal IN2 illustrated in FIG. 1, but the names of the signals are different for convenience because the connection positions of the first metal lines are different.

In this embodiment, a line for an input signal (the first metal line 713c) is added to the configuration illustrated in FIGS. 13A and 13B. However, the gate line 706c illustrated in FIG. 13A can be omitted. Thus, in a case where a plurality of circuits (not illustrated) are arranged in the vertical direction in the figure, the circuits can be arranged with a minimum pitch, and thus the entire size in the vertical direction can be reduced.

According to this embodiment, four SGTs constituting a two-input NAND circuit can be arranged in a line without providing wasteful lines and contact regions, and a semiconductor device with a reduced area can be provided.

In the above-described embodiments, a description has been given of arrangements by using examples of a process in which planar silicon layers are disposed on an insulating film, such as a buried oxide (BOX) layer disposed on a substrate. The same applies to a bulk CMOS process. As an example, FIGS. 16A and 16B illustrate an embodiment in which the embodiment illustrated in FIGS. 2A and 2B is implemented with a bulk CMOS process.

Figure 16A:
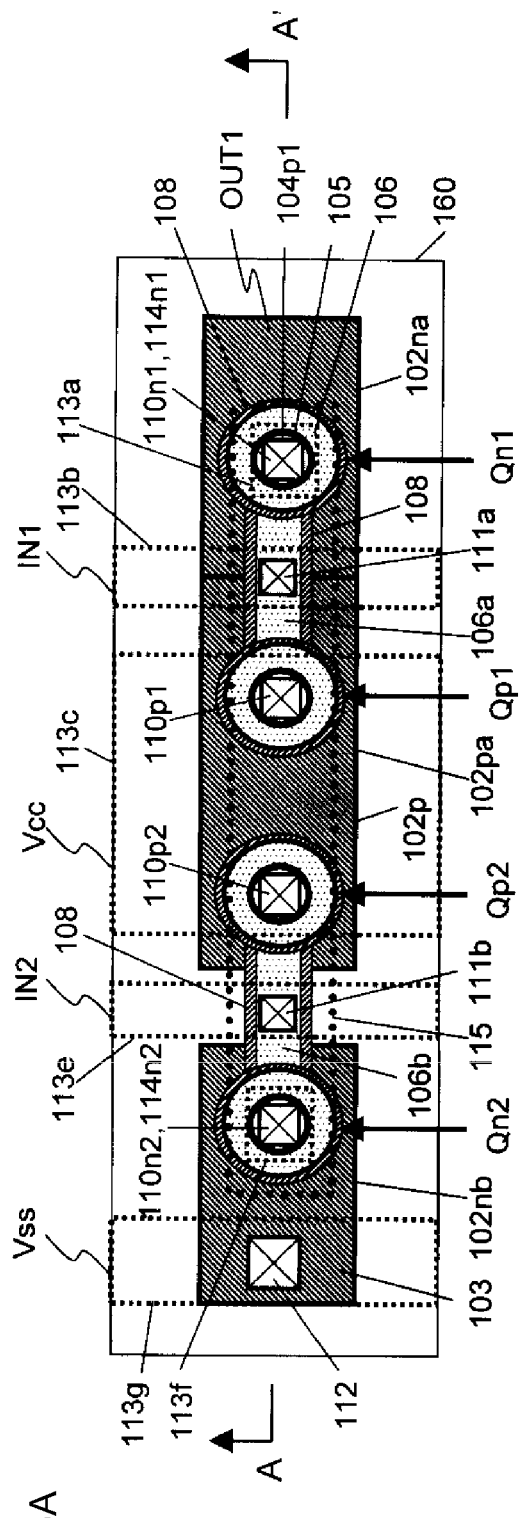
FIG. 16A is a plan view of a NAND circuit according to another embodiment of the present invention.
Figure 16B:
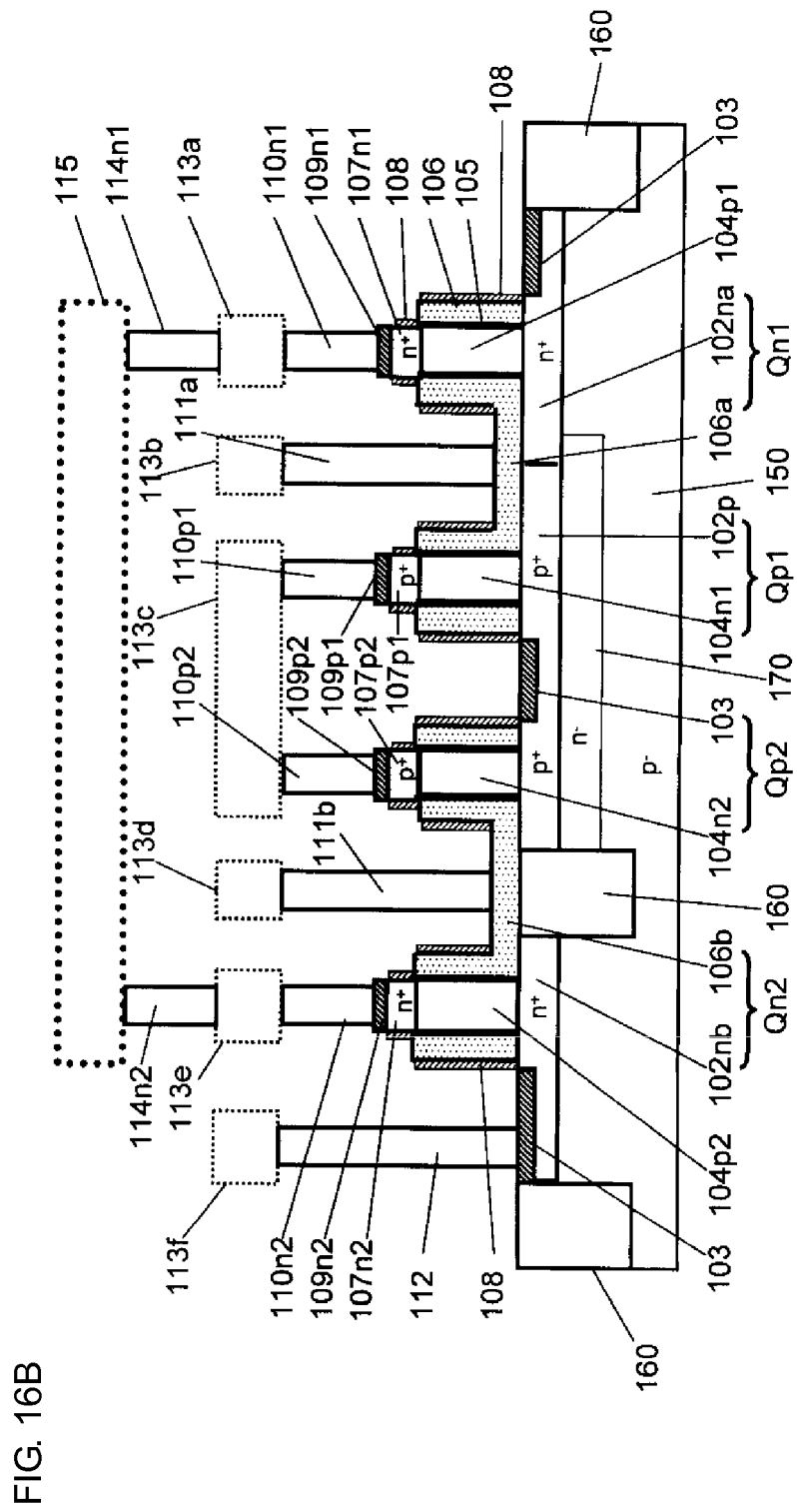
FIG. 16B is a cross-sectional view of the NAND circuit according to the other embodiment of the present invention.
Figure 17:
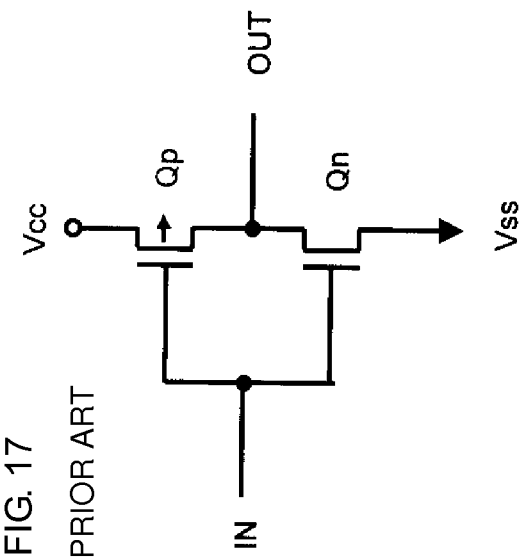
FIG. 17 is an equivalent circuit diagram of an inverter according to the prior art.

FIG. 16A is a plan view illustrating the layout (arrangement) of a two-input NAND circuit according to the present invention, and FIG. 16B is a cross-sectional view taken along a cut line A-A'. In FIG. 16A, the arrangement of the transistors is the same as that in FIG. 2A, that is, the NMOS transistor Qn1, the PMOS transistors Qp1 and Qp2, and the NMOS transistor Qn2 of the NAND circuit illustrated in FIG. 1 are arranged in a line from the right. In FIGS. 16A and 16B, the components having the same structure as that in FIGS. 2A and 2B are denoted by equivalent reference numerals in the 100s.

With reference to Japanese Patent No. 4756221, no difference is seen in the plan view in FIG. 16A between the BOX process illustrated in FIGS. 2A and 2B and the bulk CMOS process illustrated in FIGS. 16A and 16B. However, a difference therebetween can be seen in the cross-sectional view in FIG. 16B. Referring to FIG. 16B, 150 denotes a p-type silicon substrate. 160 denotes an insulator for element isolation. 170 denotes an n-region serving as an isolation layer for preventing leakage. The manufacturing process and structure of the lower diffusion layer and the upper side thereof, that is, the portion other than the p-type silicon substrate 150, the insulator 160 for element isolation, and the leakage preventing isolation layer 170, are completely the same as those of the embodiment illustrated in FIGS. 2A and 2B, and the first to twelfth embodiments of the present invention can be implemented through a bulk CMOS process. However, the insulator 160 and the leakage preventing isolation layer 170 are provided, and thus the area increases accordingly.

In the description of the embodiments, the silicon pillar of a PMOS transistor is defined as an n-type silicon layer, and the silicon pillar of an NMOS transistor is defined as a p-type silicon layer. However, in a fine process, it is difficult to control the density obtained through impurity implantation. Thus, a so-called neutral (intrinsic) semiconductor with no impurity implantation may be used for silicon pillars of the PMOS transistor and the NMOS transistor, and a difference in work function unique to a metal gate material may be used for control of a channel, that is, thresholds of PMOS and NMOS.

The primarily important aspect of the present invention is the definition of the optimum arrangement of four transistors. In a case where the transistors are arranged in the optimum order, a wiring method and wiring positions for gate lines and a wiring method and wiring positions for metal lines that are not illustrated in the figures of the embodiments are also included in the technical scope of the present invention.

The invention claimed is:

1. A semiconductor device, comprising:
    a NAND circuit including four transistors arranged in a line on a substrate, with a source, a drain, and a gate of each of the four transistors being hierarchically disposed in a direction perpendicular to the substrate, each of the four transistors having:
    a silicon pillar with an upper portion and a lower portion;
    an insulator surrounding a side surface of the silicon pillar;
    a gate surrounding the insulator;
    a source region disposed at the upper portion or the lower portion of the silicon pillar; and
    a drain region disposed at the upper portion or the lower portion of the silicon pillar and disposed on an opposite side of the source region relative to the silicon pillar,
    the four transistors including:
        a first p-channel MOS transistor,
        a second p-channel MOS transistor,
        a first n-channel MOS transistor, and
        a second n-channel MOS transistor,
    wherein:
    the gate of the first p-channel MOS transistor and the gate of the first n-channel MOS transistor are connected to one another,
    the gate of the second p-channel MOS transistor and the gate of the second n-channel MOS transistor are connected to one another,
    the drain region of the first p-channel MOS transistor, the drain region of the second p-channel MOS transistor, and the drain region of the first n-channel MOS transistor are disposed on a side of the substrate relative to the silicon pillars,
    the source region of the second n-channel MOS transistor is disposed on the side of the substrate relative to the silicon pillar,
    the drain region of the first p-channel MOS transistor, the drain region of the second p-channel MOS transistor, and the drain region of first n-channel MOS transistor are connected to one another via a silicide region,
    the source region of the first n-channel MOS transistor and the drain region of the second n-channel MOS transistor are connected to one another via a contact,
    the source region of the first p-channel MOS transistor and the source region of the second p-channel MOS transistor are connected to a power supply terminal via a contact, and
    the source region of the second n-channel MOS transistor is connected to a reference power supply terminal via a silicide region.

2. The semiconductor device according to claim 1, wherein the four transistors are arranged in a line in order of the first n-channel MOS transistor, the first p-channel MOS transistor, the second p-channel MOS transistor, and the second n-channel MOS transistor.

3. The semiconductor device according to claim 1, wherein the four transistors are arranged in a line in order of the second p-channel MOS transistor, the first p-channel MOS transistor, the first n-channel MOS transistor, and the second n-channel MOS transistor.

4. The semiconductor device according to claim 3, wherein the gate of the second p-channel MOS transistor and the gate of the second n-channel MOS transistor are connected to each other via a contact.

5. The semiconductor device according to claim 1, wherein the four transistors are arranged in a line in order of the first p-channel MOS transistor, the first n-channel MOS transistor, the second p-channel MOS transistor, and the second n-channel MOS transistor.

6. A semiconductor device, comprising:
    a NAND circuit including four transistors arranged in a line on a substrate, with a source, a drain, and a gate of each of the four transistors being hierarchically disposed in a direction perpendicular to the substrate, each of the four transistors having:
    a silicon pillar with an upper portion and a lower portion;
    an insulator surrounding a side surface of the silicon pillar;
    a gate surrounding the insulator;
    a source region disposed at the upper portion or the lower portion of the silicon pillar; and
    a drain region disposed at the upper portion or the lower portion of the silicon pillar and disposed on an opposite side of the source region relative to the silicon pillar,
    the four transistors including:
        a first p-channel MOS transistor,
        a second p-channel MOS transistor,
        a first n-channel MOS transistor, and
        a second n-channel MOS transistor, wherein:
the gate of the first p-channel MOS transistor and the gate of the first n-channel MOS transistor are connected to one another,
the gate of the second p-channel MOS transistor and the gate of the second n-channel MOS transistor are connected to one another,
the drain region of the first p-channel MOS transistor, the drain region of the second p-channel MOS transistor, the drain region of the first n-channel MOS transistor, and the drain region of the second n-channel MOS transistor are disposed on a side of the substrate relative to the silicon pillars,
the drain region of the first p-channel MOS transistor, the drain region of the second p-channel MOS transistor, and the drain region of the first n-channel MOS transistor are connected to one another via a silicide region,
the source region of the first n-channel MOS transistor and the drain region of the second n-channel MOS transistor are connected to one another via a contact and a silicide region,
the source region of the first p-channel MOS transistor and the source region of the second p-channel MOS transistor are connected to a power supply terminal via a contact, and
the source region of the second n-channel MOS transistor is connected to a reference power supply terminal via a contact.

7. The semiconductor device according to claim 6, wherein the four transistors are arranged in a line in order of the first n-channel MOS transistor, the first p-channel MOS transistor, the second p-channel MOS transistor, and the second n-channel MOS transistor.

8. The semiconductor device according to claim 6, wherein the four transistors are arranged in a line in order of the second p-channel MOS transistor, the first p-channel MOS transistor, the first n-channel MOS transistor, and the second n-channel MOS transistor.

9. The semiconductor device according to claim 8, wherein the gate of the second p-channel MOS transistor and the gate of the second n-channel MOS transistor are connected to each other via a contact.

10. A semiconductor device, comprising:
a NAND circuit including four transistors arranged in a line on a substrate, with a source, a drain, and a gate of each of the four transistors being hierarchically disposed in a direction perpendicular to the substrate, each of the four transistors having:
a silicon pillar with an upper portion and a lower portion;
an insulator surrounding a side surface of the silicon pillar;
a gate surrounding the insulator;
a source region disposed at the upper portion or the lower portion of the silicon pillar; and
a drain region disposed at the upper portion or lower portion of the silicon pillar and disposed on an opposite side of the source region relative to the silicon pillar,
the four transistors including
a first p-channel MOS transistor,
a second p-channel MOS transistor,
a first n-channel MOS transistor, and
a second n-channel MOS transistor,
wherein:
the gate of the first p-channel MOS transistor and the gate of the first n-channel MOS transistor are connected to one another,
the gate of the second p-channel MOS transistor and the gate of the second n-channel MOS transistor are connected to one another,
the drain region of the first p-channel MOS transistor, the drain region of the second p-channel MOS transistor, and the drain region of the first n-channel MOS transistor are disposed on a side of the substrate relative to the silicon pillars,
the source region of the second n-channel MOS transistor is disposed on the side of the substrate relative to the silicon pillar,
the drain region of the first p-channel MOS transistor, the drain region of the second p-channel MOS transistor, and the drain region of first n-channel MOS transistor are connected to one another via a silicide region,
the source region of the first n-channel MOS transistor and the drain region of the second n-channel MOS transistor are connected to one another via a contact and a silicide region,
the source region of the first p-channel MOS transistor and the source region of the second p-channel MOS transistor are connected to a power supply terminal via a contact,
the source region of the second n-channel MOS transistor is connected to a reference power supply terminal via a contact, and
the four transistors are arranged in a line in order of the first p-channel MOS transistor, the first n-channel MOS transistor, the second p-channel MOS transistor, and the second n-channel MOS transistor.

11. A semiconductor device, comprising:
a NAND circuit including four transistors arranged in a line on a substrate, with a source, a drain, and a gate of each of the four transistors being hierarchically disposed in a direction perpendicular to the substrate, each of the four transistors having:
a silicon pillar with an upper portion and a lower portion;
an insulator surrounding a side surface of the silicon pillar;
a gate surrounding the insulator;
a source region disposed at the upper portion or the lower portion of the silicon pillar; and
a drain region disposed at the upper portion or the lower portion of the silicon pillar and disposed on an opposite side of the source region relative to the silicon pillar,
the four transistors including
a first p-channel MOS transistor,
a second p-channel MOS transistor,
a first n-channel MOS transistor, and
a second n-channel MOS transistor,
wherein:
the gate of the first p-channel MOS transistor and the gate of the first n-channel MOS transistor are connected to one another,
the gate of the second p-channel MOS transistor and the gate of the second n-channel MOS transistor are connected to one another, the source region of the first p-channel MOS transistor, the source region of
the second p-channel MOS transistor, and the source region of the first n-channel MOS transistor are disposed on a side of the substrate relative to the silicon pillars,
the drain region of the second n-channel MOS transistor is disposed on the side of the substrate relative to the silicon pillar,
the drain region of the first p-channel MOS transistor, the drain region of the second p-channel MOS transistor, and the drain region of first n-channel MOS transistor are connected to one another via a contact, the source region of the first n-channel MOS transistor and the drain region of the second n-channel MOS transistor are connected to one another via a silicide region, the source region of the first p-channel MOS transistor and the source region of the second p-channel MOS transistor are connected to a power supply terminal via a silicide region, and the source region of the second n-channel MOS transistor is connected to a reference power supply terminal via a contact.

12. The semiconductor device according to claim 11, wherein the four transistors are arranged in a line in order of the first p-channel MOS transistor, the first n-channel MOS transistor, the second n-channel MOS transistor, and the second p-channel MOS transistor.

13. The semiconductor device according to claim 12, wherein the source region of the first p-channel MOS transistor and the source region of the second p-channel MOS transistor are connected to the power supply terminal via a silicide region and a contact, the silicide region extending in a direction perpendicular to a direction in which the four transistors are arranged in a line.

14. The semiconductor device according to claim 13, wherein the NAND circuit is one of a plurality of NAND circuits that are arranged in a direction perpendicular to the direction in which the four transistors are arranged in a line, the extended silicide regions are connected to one another, and one of the plurality of NAND circuits is connected to the power supply terminal via the extended silicide regions and a contact.

15. The semiconductor device according to claim 11, wherein the four transistors are arranged in a line in order of the second p-channel MOS transistor, the first p-channel MOS transistor, the first n-channel MOS transistor, and the second n-channel MOS transistor.

16. The semiconductor device according to claim 15, wherein a gate line of the second p-channel MOS transistor and a gate line of the second n-channel MOS transistor are supplied with signals through different signal lines via contacts.

\* \* \* \* \*